(12) United States Patent
Ashida et al.

(10) Patent No.: US 10,658,720 B2
(45) Date of Patent: May 19, 2020

(54) MULTILAYER ELECTRONIC COMPONENT

(71) Applicant: TDK CORPORATION, Tokyo (JP)

(72) Inventors: Yuta Ashida, Tokyo (JP); Noriyuki Hirabayashi, Tokyo (JP); Shigemitsu Tomaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/980,206

(22) Filed: May 15, 2018

(65) Prior Publication Data

US 2019/0007018 A1 Jan. 3, 2019

(30) Foreign Application Priority Data

Jul. 3, 2017 (JP) .................................. 2017-130061

(51) Int. Cl.
*H01P 1/203* (2006.01)
*H03H 7/38* (2006.01)
*H03H 7/01* (2006.01)
*H03H 1/00* (2006.01)

(52) U.S. Cl.
CPC .......... *H01P 1/20345* (2013.01); *H01P 1/203* (2013.01); *H03H 1/00* (2013.01); *H03H 7/0138* (2013.01); *H03H 7/38* (2013.01); *H03H 2001/0085* (2013.01)

(58) Field of Classification Search
CPC ................. H01P 1/203; H01P 1/20345; H03H 2001/0085; H03H 7/38
USPC ................................ 333/175, 185, 204, 205
See application file for complete search history.

(56) References Cited

U.S. PATENT DOCUMENTS

2011/0316652 A1* 12/2011 Satoh .................. H01P 1/20345
333/204

FOREIGN PATENT DOCUMENTS

JP 2003-008385 A 1/2003

* cited by examiner

*Primary Examiner* — Rakesh B Patel
(74) *Attorney, Agent, or Firm* — Oliff PLC

(57) ABSTRACT

A multilayer electronic component includes a multilayer stack, and a band elimination filter formed using the multilayer stack. The band elimination filter includes a first input/output end, a second input/output end, a connection path connecting the first and second input/output ends, and a resonator coupled to the connection path. The connection path includes an impedance transformer. The resonator includes a first conductor line constituting a first distributed constant line. The impedance transformer includes a second conductor line constituting a second distributed constant line, and a through hole line section connected in series to the second conductor line.

18 Claims, 20 Drawing Sheets

MULTILAYER ELECTRONIC COMPONENT

BACKGROUND OF THE INVENTION

1. Field of the Invention

The present invention relates to a multilayer electronic component including a band elimination filter.

2. Description of the Related Art

The standardization of fifth-generation mobile communication systems (hereinafter referred to as 5 G) is currently ongoing. For 5 G, the use of frequency bands of 10 GHz or higher, particularly a quasi-millimeter wave band of 10 to 30 GHz and a millimeter wave band of 30 to 300 GHz, is being studied to expand the frequency band.

Examples of electronic components for use in communication apparatuses include one that includes a band elimination filter and is formed using a multilayer stack. The multilayer stack includes a plurality of dielectric layers and a plurality of conductor layers stacked together. Such an electronic component is disclosed in, for example, JP2003-008385A.

In the electronic component disclosed in JP2003-008385A, the band elimination filter is constructed of an LC circuit formed using a multilayer stack. The LC circuit is a circuit composed of a combination of an inductor and a capacitor, both of which are lumped constant elements.

When a band elimination filter having a stopband in a quasi-millimeter or millimeter wave band is to be implemented with an LC circuit formed using a multilayer stack, there arises the following problem. The inductor required in such a case is a spiral-shaped inductor having an extremely small length, more specifically, a length smaller than the wavelength corresponding to the center frequency of the stopband. However, such an inductor is extremely difficult to fabricate with high precision using a multilayer stack. When actually fabricated, the inductors may thus greatly vary in shape and characteristic, and accordingly, band elimination filters fabricated with such inductors may also greatly vary in characteristic. For this reason, when a band elimination filter having a stopband in a quasi-millimeter or millimeter wave band is to be implemented with an LC circuit formed using a multilayer stack, the problem is that it is difficult to fabricate the band elimination filter to provide a desired characteristic.

SUMMARY OF THE INVENTION

It is an object of the present invention to provide a multilayer electronic component that includes a band elimination filter having a stopband in a quasi-millimeter or millimeter wave band, and enables easy implementation of the band elimination filter.

A multilayer electronic component of the present invention includes a multilayer stack, and a band elimination filter formed using the multilayer stack. The multilayer stack includes a plurality of dielectric layers and a plurality of conductor layers stacked together. The band elimination filter includes a first input/output end, a second input/output end, a connection path connecting the first input/output end and the second input/output end, and a first resonator coupled to the connection path. The connection path includes an impedance transformer.

The first resonator includes a first conductor line constituting a first distributed constant line. The impedance transformer includes a second conductor line constituting a second distributed constant line, and a through hole line section connected in series to the second conductor line. Each of the first and second conductor lines is formed of at least one of the plurality of conductor layers. The through hole line section includes at least one through hole provided in the multilayer stack.

In the multilayer electronic component of the present invention, the band elimination filter may further include a capacitor for coupling the first resonator to the connection path. The capacitor has a first end and a second end opposite to each other in circuit configuration. The through hole line section has a first end and a second end opposite to each other in circuit configuration. The first end of the capacitor may be electrically connected to the first end of the through hole line section. The second end of the capacitor may be electrically connected to the first conductor line. The second end of the through hole line section may be electrically connected to the second conductor line. The first end of the capacitor and the first end of the through hole line section may be electrically connected to one of the first and second input/output ends. As used herein, the phrase "in circuit configuration" is to describe layout in a circuit diagram, not in a physical configuration.

In the multilayer electronic component of the present invention, the through hole line section may include a plurality of through holes connected in series. The plurality of through holes may be arranged such that central axes thereof are collinear. Alternatively, the plurality of through holes may be arranged such that central axes of at least two of the plurality of through holes are not collinear.

In the multilayer electronic component of the present invention, the first conductor line may have a first end and a second end, the first end being closest to the connection path in circuit configuration, the second end being farthest from the connection path in circuit configuration. The second end of the first conductor line may be connected to a ground or be open.

The multilayer electronic component of the present invention may further include a filter section formed using the multilayer stack and electrically connected to the band elimination filter. The filter section may be a band pass filter.

In the multilayer electronic component of the present invention, the band elimination filter may further include a second resonator formed using the multilayer stack. In such a case, the first resonator is coupled to the connection path at a first point, and the second resonator is coupled to the connection path at a second point. Further, in such a case, the impedance transformer may be located between the first point and the second point in circuit configuration.

The multilayer electronic component of the present invention includes the band elimination filter formed using the multilayer stack. In the band elimination filter, the first resonator includes the first conductor line constituting the first distributed constant line, and the impedance transformer includes the second conductor line constituting the second distributed constant line. The first and second conductor lines can be fabricated using the multilayer stack with higher precision as compared with a spiral-shaped inductor that may be used for an LC circuit. The present invention thus enables reduction or elimination of characteristic variations of the band elimination filter.

Further, in the present invention, the impedance transformer includes the through hole line section in addition to the second conductor line, the through hole line section being connected in series to the second conductor line. According to the present invention, the impedance transformer can be easily designed and fabricated by utilizing the structural features of the multilayer stack.

By virtue of the foregoing, the present invention enables easy implementation of a band elimination filter formed using a multilayer stack and having a stopband in a quasi-millimeter or millimeter wave band.

Other and further objects, features and advantages of the invention will appear more fully from the following description.

DETAILED DESCRIPTION OF THE PREFERRED EMBODIMENTS

First Embodiment

Figure 1:
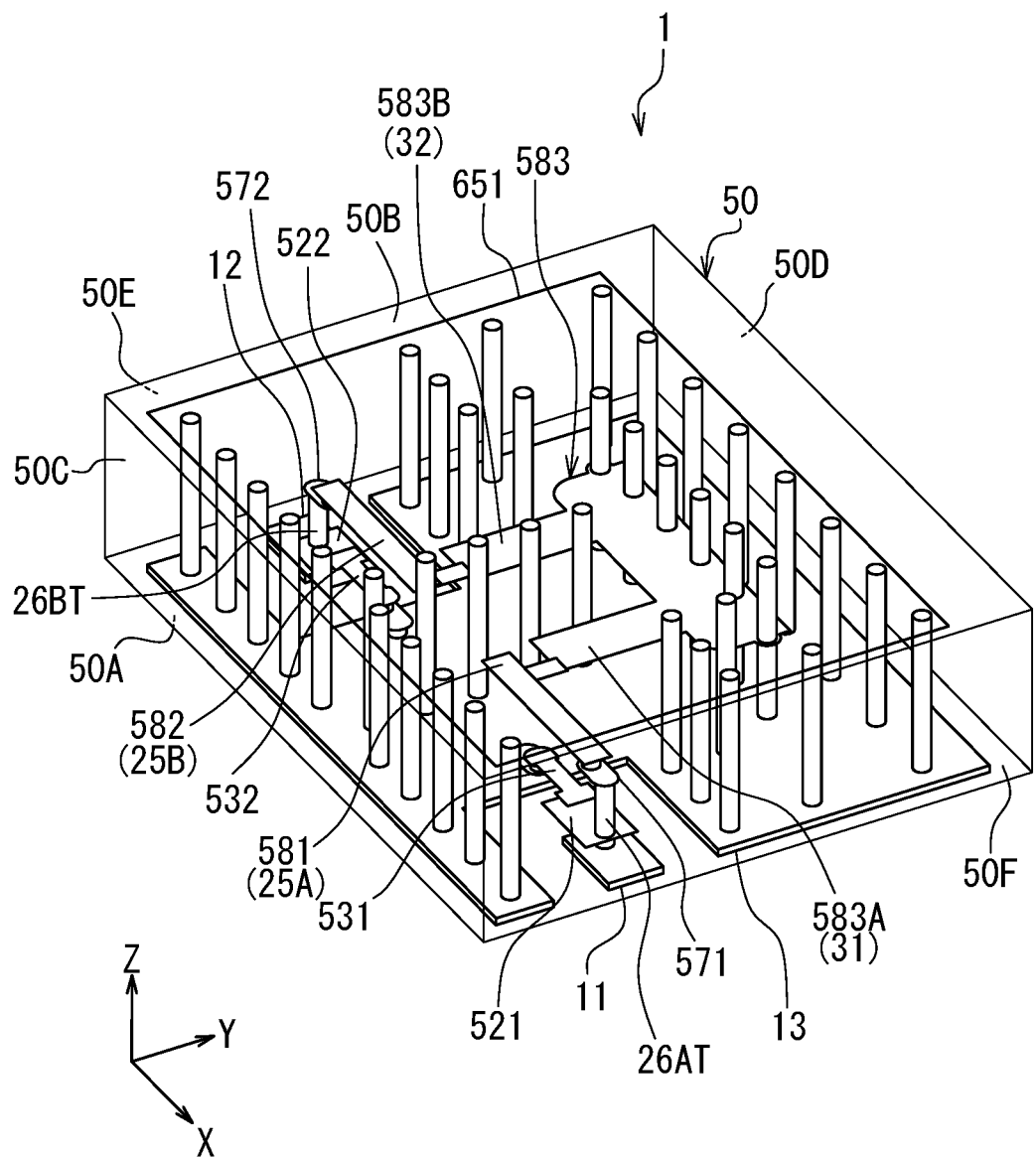
FIG. 1 is a perspective view illustrating the structure of a multilayer electronic component according to a first embodiment of the invention.

Preferred embodiments of the present invention will now be described in detail with reference to the drawings. First, a description will be given of the configuration of a multilayer electronic component according to a first embodiment of the invention. FIG. 1 is a perspective view illustrating the structure of the multilayer electronic component according to the first embodiment.

As shown in FIG. 1, the multilayer electronic component 1 according to the present embodiment includes a multilayer stack 50. As will be described in detail later, the multilayer stack 50 includes a plurality of dielectric layers and a plurality of conductor layers stacked together.

Here, X, Y and Z directions are defined as shown in FIG. 1. The X, Y and Z directions are orthogonal to one another. In the present embodiment, the Z direction is a direction parallel to the direction in which the plurality of dielectric layers are stacked.

The multilayer stack 50 is in the shape of a rectangular solid. The multilayer stack 50 has a top surface 50B and a bottom surface 50A located at opposite ends of the multilayer stack 50 in the Z direction, and four side surfaces 50C, 50D, 50E and 50F connecting the top surface 50B and the bottom surface 50A. The side surfaces 50C and 50D are located at opposite ends of the multilayer stack 50 in the Y direction. The side surfaces 50E and 50F are located at opposite ends of the multilayer stack 50 in the X direction.

The multilayer electronic component 1 has a first input/output terminal 11, a second input/output terminal 12 and a ground conductor layer 13 provided on the bottom surface 50A of the multilayer stack 50. The ground conductor layer 13 is connected to the ground.

Figure 2:
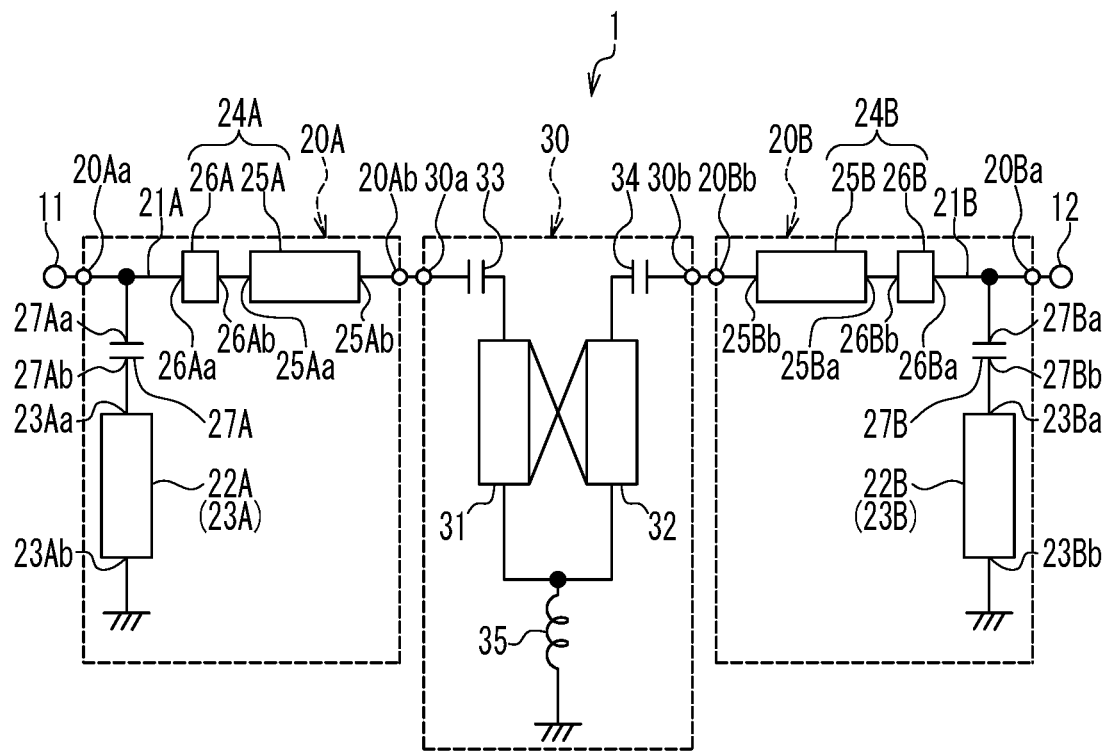
FIG. 2 is a circuit diagram illustrating the circuit configuration of the multilayer electronic component according to the first embodiment of the invention.

FIG. 2 is a circuit diagram illustrating the circuit configuration of the multilayer electronic component 1 according to the present embodiment. As shown in FIG. 2, the multilayer electronic component 1 further includes a first band elimination filter 20A, a second band elimination filter 20B, and a filter section 30. The first and second band elimination filters 20A and 20B and the filter section 30 are formed using the multilayer stack 50. The filter section 30 is electrically connected to the first and second band elimination filters 20A and 20B. The filter section 30 is any filter other than a band elimination filter. In the present embodiment, the filter section 30 is particularly a band pass filter.

The filter section 30 has a first input/output end 30a and a second input/output end 30b. The first input/output end 30a is closest to the first input/output terminal 11 in circuit configuration, and the second input/output end 30b is closest to the second input/output terminal 12 in circuit configuration. The first band elimination filter 20A is provided between the first input/output terminal 11 and the first input/output end 30a of the filter section 30 in circuit configuration. The second band elimination filter 20B is provided between the second input/output terminal 12 and the second input/output end 30b of the filter section 30 in circuit configuration.

The filter section 30 includes two resonators 31 and 32, two capacitors 33 and 34, and an inductor 35. The resonators 31 and 32 are configured to be electromagnetically coupled to each other. Each of the resonators 31 and 32 has a first end and a second end opposite to each other in circuit configuration. In circuit configuration, the capacitor 33 is provided between the first input/output end 30a of the filter section 30 and the first end of the resonator 31, and the capacitor 34 is provided between the second input/output end 30b of the filter section 30 and the first end of the resonator 32. The second end of the resonator 31 and the second end of the resonator 32 are electrically connected to each other. In circuit configuration, the inductor 35 is provided between the ground and the second ends of the resonators 31 and 32.

The inductor 35 plays the role of adjusting the magnitude of magnetic coupling between the resonators 31 and 32.

The first band elimination filter 20A has a first input/output end 20Aa, a second input/output end 20Ab, a connection path 21A connecting the first input/output end 20Aa and the second input/output end 20Ab, and a resonator 22A coupled to the connection path 21A. The resonator 22A corresponds to the first resonator in the present invention. The first input/output end 20Aa is electrically connected to the first input/output terminal 11. The second input/output end 20Ab is electrically connected to the first input/output end 30a of the filter section 30. The connection path 21A includes an impedance transformer 24A. The impedance transformer 24A is a transmission line for impedance matching.

The resonator 22A includes a first conductor line 23A constituting a first distributed constant line in the first band elimination filter 20A. The impedance transformer 24A includes a second conductor line 25A constituting a second distributed constant line in the first band elimination filter 20A, and a through hole line section 26A connected in series to the second conductor line 25A. Each of the first conductor line 23A and the second conductor line 25A is formed of at least one of the plurality of conductor layers of the multilayer stack 50. The through hole line section 26A includes at least one through hole provided in the multilayer stack 50.

The first conductor line 23A has a first end 23Aa and a second end 23Ab. The first end 23Aa is closest to the connection path 21A in circuit configuration, and the second end 23Ab is farthest from the connection path 21A in circuit configuration.

The second conductor line 25A has a first end 25Aa and a second end 25Ab. The first end 25Aa is closest to the first input/output end 20Aa in circuit configuration, and the second end 25Ab is farthest from the first input/output end 20Aa in circuit configuration.

The band elimination filter 20A further includes a capacitor 27A for coupling the resonator 22A to the connection path 21A. The strength of coupling of the resonator 22A to the connection path 21A can be adjusted by adjusting the capacitance of the capacitor 27A.

The capacitor 27A has a first end 27Aa and a second end 27Ab opposite to each other in circuit configuration. The first end 27Aa of the capacitor 27A is electrically connected to the connection path 21A. The second end 27Ab of the capacitor 27A is electrically connected to the first end 23Aa of the first conductor line 23A. The second end 23Ab of the first conductor line 23A is connected to the ground.

The through hole line section 26A has a first end 26Aa and a second end 26Ab opposite to each other in circuit configuration. The first end 27Aa of the capacitor 27A is electrically connected to the first end 26Aa of the through hole line section 26A. The first end 27Aa of the capacitor 27A and the first end 26Aa of the through hole line section 26A are electrically connected to the first input/output end 20Aa.

The second end 26Ab of the through hole line section 26A is electrically connected to the first end 25Aa of the second conductor line 25A. The second end 25Ab of the second conductor line 25A is electrically connected to the second input/output end 20Ab.

The second band elimination filter 20B has a first input/output end 20Ba, a second input/output end 20Bb, a connection path 21B connecting the first input/output end 20Ba and the second input/output end 20Bb, and a resonator 22B coupled to the connection path 21B. The resonator 22B corresponds to the first resonator in the present invention.

The first input/output end 20Ba is electrically connected to the second input/output terminal 12. The second input/output end 20Bb is electrically connected to the second input/output end 30b of the filter section 30. The connection path 21B includes an impedance transformer 24B. The impedance transformer 24B is a transmission line for impedance matching.

The resonator 22B includes a first conductor line 23B constituting a first distributed constant line in the second band elimination filter 20B. The impedance transformer 24B includes a second conductor line 25B constituting a second distributed constant line in the second band elimination filter 20B, and a through hole line section 26B connected in series to the second conductor line 25B. Each of the first conductor line 23B and the second conductor line 25B is formed of at least one of the plurality of conductor layers of the multilayer stack 50. The through hole line section 26B includes at least one through hole provided in the multilayer stack 50.

The first conductor line 23B has a first end 23Ba and a second end 23Bb. The first end 23Ba is closest to the connection path 21B in circuit configuration, and the second end 23Bb is farthest from the connection path 21B in circuit configuration.

The second conductor line 25B has a first end 25Ba and a second end 25Bb. The first end 25Ba is closest to the first input/output end 20Ba in circuit configuration, and the second end 25Bb is farthest from the first input/output end 20Ba in circuit configuration.

The band elimination filter 20B further includes a capacitor 27B for coupling the resonator 22B to the connection path 21B. The strength of coupling of the resonator 22B to the connection path 21B can be adjusted by adjusting the capacitance of the capacitor 27B.

The capacitor 27B has a first end 27Ba and a second end 27Bb opposite to each other in circuit configuration. The first end 27Ba of the capacitor 27B is electrically connected to the connection path 21B. The second end 27Bb of the capacitor 27B is electrically connected to the first end 23Ba of the first conductor line 23B. The second end 23Bb of the first conductor line 23B is connected to the ground.

The through hole line section 26B has a first end 26Ba and a second end 26Bb opposite to each other in circuit configuration. The first end 27Ba of the capacitor 27B is electrically connected to the first end 26Ba of the through hole line section 26B. The first end 27Ba of the capacitor 27B and the first end 26Ba of the through hole line section 26B are electrically connected to the first input/output end 20Ba.

The second end 26Bb of the through hole line section 26B is electrically connected to the first end 25Ba of the second conductor line 25B. The second end 25Bb of the second conductor line 25B is electrically connected to the second input/output end 20Bb.

In the present embodiment, the resonators 22A and 22B are both quarter-wave resonators. The resonant frequency of the resonator 22A is the same or nearly the same as the center frequency of the stopband of the first band elimination filter 20A. The resonant frequency of the resonator 22B is the same or nearly the same as the center frequency of the stopband of the second band elimination filter 20B.

The resonant frequency of the resonator 22A is determined in consideration of the capacitance of the capacitor 27A. In this case, given the same resonant frequency, the length of the first conductor line 23A is smaller than in the case without the capacitor 27A. Consequently, the length of the first conductor line 23A is smaller than a quarter of the wavelength corresponding to the center frequency of the stopband of the first band elimination filter 20A.

Likewise, the resonant frequency of the resonator 22B is determined in consideration of the capacitance of the capacitor 27B. In this case, given the same resonant frequency, the length of the first conductor line 23B is smaller than in the case without the capacitor 27B. Consequently, the length of the first conductor line 23B is smaller than a quarter of the wavelength corresponding to the center frequency of the stopband of the second band elimination filter 20B.

The stopband of the first band elimination filter 20A and the stopband of the second band elimination filter 20B may or may not coincide with each other.

The length of the shortest current path in the impedance transformer 24A and the length of the shortest current path in the impedance transformer 24B are both equal to or nearly equal to a quarter of the wavelength corresponding to the center frequency of the passband of the filter section 30, which is a band pass filter.

In the present embodiment, the passband of the filter section 30, which is a band pass filter, and the stopbands of the first and second band elimination filters 20A and 20B are all in a quasi-millimeter wave band of 10 to 30 GHz or a millimeter wave band of 30 to 300 GHz. Further, the stopband of the first band elimination filter 20A and the stopband of the second band elimination filter 20B are both in a frequency region higher than the passband of the filter section 30. The multilayer electronic component 1 as a whole has the function of a band pass filter.

Reference is now made to FIG. 3 to FIG. 10 to describe a plurality of dielectric layers constituting the multilayer stack 50 and the configuration of a plurality of conductor layers formed on the dielectric layers and a plurality of through holes formed in the dielectric layers. The multilayer stack 50 includes sixteen dielectric layers stacked together. The sixteen dielectric layers will be referred to as the first to sixteenth dielectric layers in the order from bottom to top.

Figure 3:
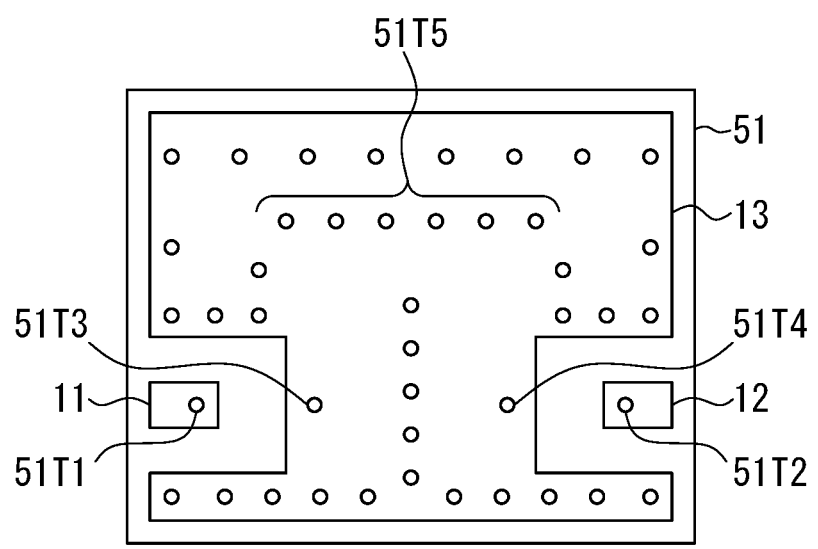
FIG. 3 is an explanatory diagram illustrating a patterned surface of a first dielectric layer of the multilayer stack shown in FIG. 1.

FIG. 3 illustrates a patterned surface of the first dielectric layer 51. The first input/output terminal 11, the second input/output terminal 12 and the ground conductor layer 13 are formed on the patterned surface of the dielectric layer 51.

Further, formed in the dielectric layer 51 are a through hole 51T1 connected to the first input/output terminal 11, a through hole 51T2 connected to the second input/output terminal 12, and forty-one through holes connected to the ground conductor layer 13. The forty-one through holes connected to the ground conductor layer 13 are: a through hole 51T3 included in the first band elimination filter 20A; a through hole 51T4 included in the second band elimination filter 20B; six through holes 51T5 included in the filter section 30; and thirty-three ground through holes. In FIG. 3, the thirty-three ground through holes are represented by unlabeled circles.

Figure 4:
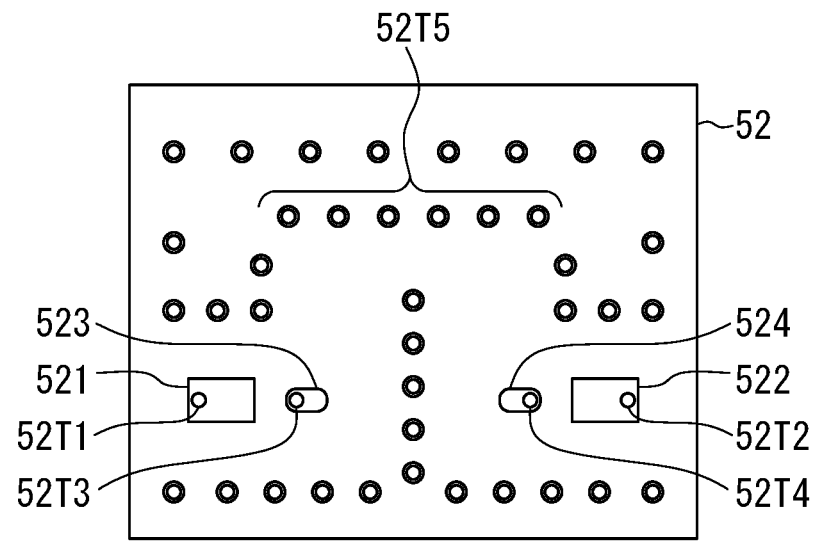
FIG. 4 is an explanatory diagram illustrating a patterned surface of a second dielectric layer of the multilayer stack shown in FIG. 1.

FIG. 4 illustrates a patterned surface of the second dielectric layer 52. On the patterned surface of the dielectric layer 52, there are formed conductor layers 521 and 522 for capacitor(s), and conductor layers 523 and 524. The through holes 51T1, 51T2, 51T3 and 51T4 shown in FIG. 3 are connected to the conductor layers 521, 522, 523 and 524, respectively.

Further, formed in the dielectric layer 52 are through holes 52T1 and 52T2 for through hole line section(s), and through holes 52T3 and 52T4. The through holes 52T1, 52T2, 52T3 and 52T4 are connected to the conductor layers 521, 522, 523 and 524, respectively.

Further, formed in the dielectric layer 52 are six through holes 52T5 connected to the six through holes 51T5 shown in FIG. 3, and thirty-three ground through holes connected to the thirty-three ground through holes shown in FIG. 3. In FIG. 4, the thirty-three ground through holes are represented by unlabeled double circles. The same way of representation applies to FIG. 5 to FIG. 9.

Figure 5:
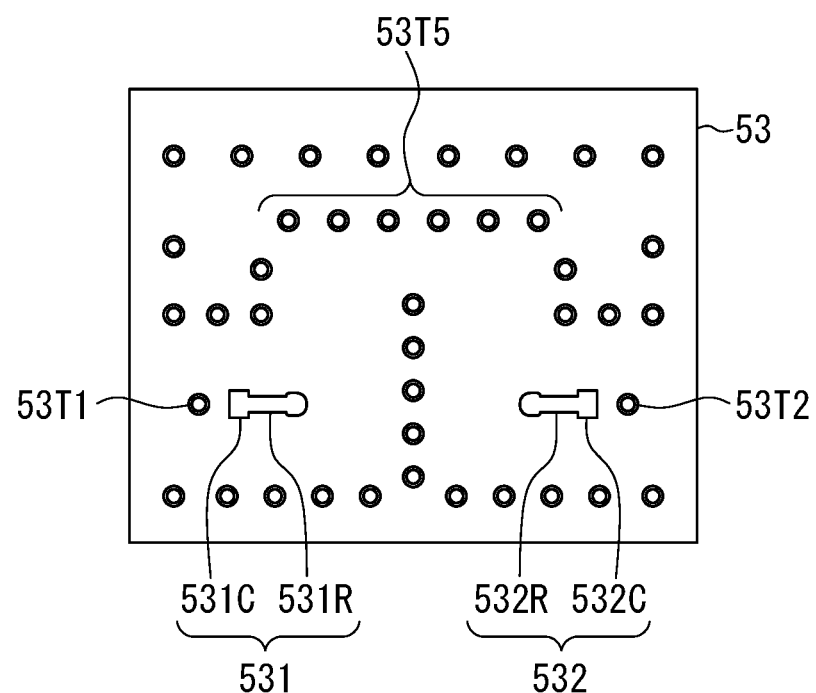
FIG. 5 is an explanatory diagram illustrating a patterned surface of a third dielectric layer of the multilayer stack shown in FIG. 1.

FIG. 5 illustrates a patterned surface of the third dielectric layer 53. Conductor layers 531 and 532 are formed on the patterned surface of the dielectric layer 53.

The conductor layer 531 includes a capacitor-forming portion 531C and a resonator-forming portion 531R. The capacitor-forming portion 531C is opposed to the conductor layer 521 shown in FIG. 4 with the dielectric layer 52 interposed therebetween. The resonator-forming portion 531R is shaped to be elongated in the X direction. The resonator-forming portion 531R has a first end and a second end opposite to each other in the X direction. The first end of the resonator-forming portion 531R is connected to the capacitor-forming portion 531C. The through hole 52T3 shown in FIG. 4 is connected to a portion of the resonator-forming portion 531R near the second end thereof.

The conductor layer 532 includes a capacitor-forming portion 532C and a resonator-forming portion 532R. The capacitor-forming portion 532C is opposed to the conductor layer 522 shown in FIG. 4 with the dielectric layer 52 interposed therebetween. The resonator-forming portion 532R is shaped to be elongated in the X direction. The resonator-forming portion 532R has a first end and a second end opposite to each other in the X direction. The first end of the resonator-forming portion 532R is connected to the capacitor-forming portion 532C. The through hole 52T4 shown in FIG. 4 is connected to a portion of the resonator-forming portion 532R near the second end thereof.

Further, through holes 53T1 and 53T2 for through hole line section(s) are formed in the dielectric layer 53. The through holes 52T1 and 52T2 shown in FIG. 4 are connected to the through holes 53T1 and 53T2, respectively.

Further, formed in the dielectric layer 53 are six through holes 53T5 connected to the six through holes 52T5 shown in FIG. 4, and thirty-three ground through holes connected to the thirty-three ground through holes shown in FIG. 4.

Figure 6:
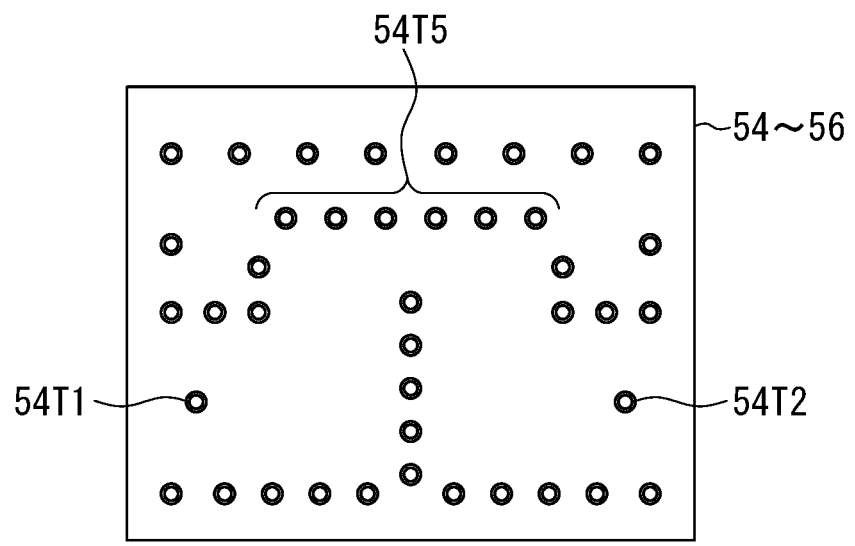
FIG. 6 is an explanatory diagram illustrating a patterned surface of each of a fourth to a sixth dielectric layer of the multilayer stack shown in FIG. 1.

FIG. 6 illustrates a patterned surface of each of the fourth to sixth dielectric layers 54 to 56. Through holes 54T1 and 54T2 for through hole line section(s), six through holes 54T5, and thirty-three ground through holes are formed in each of the dielectric layers 54 to 56.

The through holes 53T1 and 53T2 shown in FIG. 5 are respectively connected to the through holes 54T1 and 54T2 formed in the fourth dielectric layer 54. The six through holes 53T5 shown in FIG. 5 are connected to the six through holes 54T5 formed in the fourth dielectric layer 54. The thirty-three ground through holes shown in FIG. 5 are connected to the thirty-three ground through holes formed in the fourth dielectric layer 54. In the dielectric layers 54 to 56, every vertically adjacent through holes are connected to each other.

Figure 7:
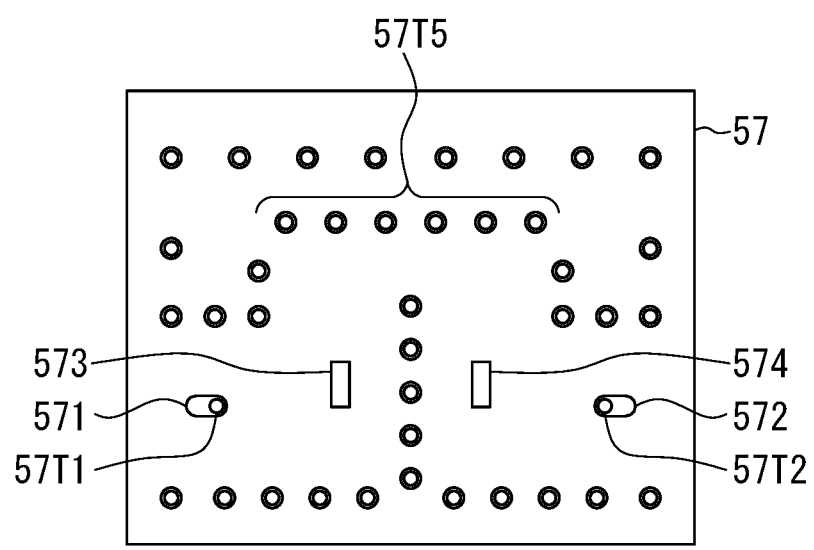
FIG. 7 is an explanatory diagram illustrating a patterned surface of a seventh dielectric layer of the multilayer stack shown in FIG. 1.

FIG. 7 illustrates a patterned surface of the seventh dielectric layer 57. On the patterned surface of the dielectric layer 57, there are formed conductor layers 571 and 572 for through hole line section(s) and conductor layers 573 and 574 for capacitor(s). The through holes 54T1 and 54T2 formed in the sixth dielectric layer 56 (see FIG. 6) are connected to the conductor layers 571 and 572, respectively.

Further, formed in the dielectric layer 57 are a through hole 57T1 connected to the conductor layer 571, a through hole 57T2 connected to the conductor layer 572, six through holes 57T5, and thirty-three ground through holes. The six through holes 54T5 formed in the sixth dielectric layer 56 (see FIG. 6) are connected to the six through holes 57T5. The thirty-three ground through holes formed in the sixth dielectric layer 56 (see FIG. 6) are connected to the thirty-three ground through holes formed in the dielectric layer 57.

Figure 8:
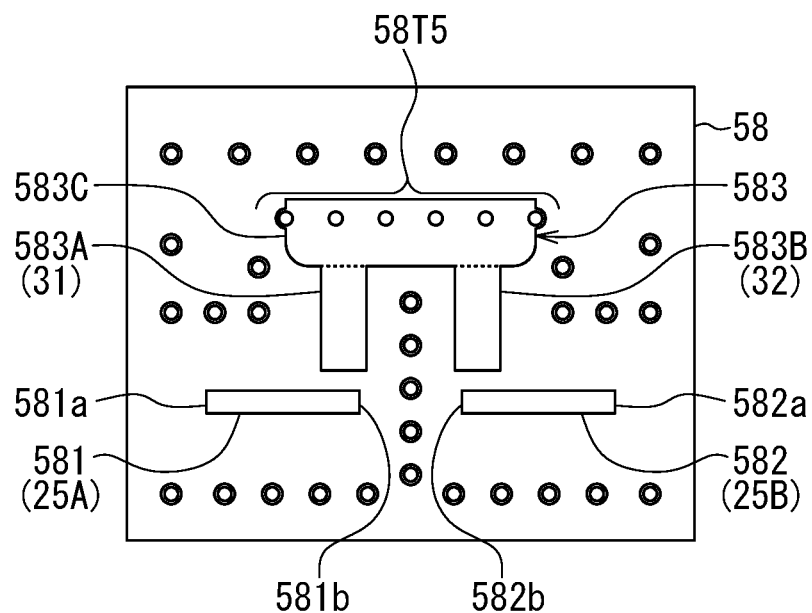
FIG. 8 is an explanatory diagram illustrating a patterned surface of an eighth dielectric layer of the multilayer stack shown in FIG. 1.

FIG. 8 illustrates a patterned surface of the eighth dielectric layer 58. Conductor layers 581, 582 and 583 are formed on the patterned surface of the eighth dielectric layer 58. The conductor layer 581 forms the second conductor line 25A of the first band elimination filter 20A. The conductor layer 582 forms the second conductor line 25B of the second band elimination filter 20B.

Both the conductor layers 581 and 582 are shaped to be elongated in the X direction. The conductor layer 581 has a first end 581a and a second end 581b opposite to each other in the X direction. The first end 581a corresponds to the first end 25Aa of the second conductor line 25A. The second end 581b corresponds to the second end 25Ab of the second conductor line 25A. The conductor layer 582 has a first end 582a and a second end 582b opposite to each other in the X direction. The first end 582a corresponds to the first end 25Ba of the second conductor line 25B. The second end 582b corresponds to the second end 25Bb of the second conductor line 25B.

The through hole 57T1 shown in FIG. 7 is connected to a portion of the conductor layer 581 near the first end 581a thereof. The through hole 57T2 shown in FIG. 7 is connected to a portion of the conductor layer 582 near the first end 582a thereof.

The conductor layer 583 includes a resonator-forming portion 583A forming the resonator 31, a resonator-forming portion 583B forming the resonator 32, and a coupling portion 583C coupling the resonator-forming portions 583A and 583B to each other. In FIG. 8 the boundary between the coupling portion 583C and the resonator-forming portion 583A and the boundary between the coupling portion 583C and the resonator-forming portion 583B are indicated by dotted lines.

A portion of the conductor layer 573 shown in FIG. 7 is opposed to a portion of the conductor layer 581 near the second end 581b thereof with the dielectric layer 57 interposed therebetween. Another portion of the conductor layer 573 is opposed to a portion of the resonator-forming portion 583A with the dielectric layer 57 interposed therebetween.

A portion of the conductor layer 574 shown in FIG. 7 is opposed to a portion of the conductor layer 582 near the second end 582b thereof with the dielectric layer 57 interposed therebetween. Another portion of the conductor layer 574 is opposed to a portion of the resonator-forming portion 583B with the dielectric layer 57 interposed therebetween.

Further, formed in the dielectric layer 58 are six through holes 58T5 connected to the coupling portion 583C of the conductor layer 583, and thirty-three ground through holes. The six through holes 57T5 shown in FIG. 7 are connected to the six through holes 58T5. The thirty-three ground through holes formed in the dielectric layer 57 of FIG. 7 are connected to the thirty-three ground through holes formed in the dielectric layer 58.

Figure 9:
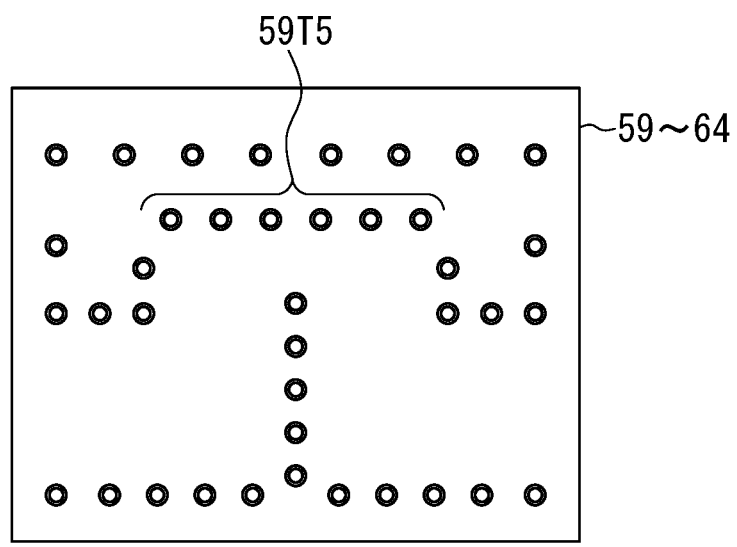
FIG. 9 is an explanatory diagram illustrating a patterned surface of each of a ninth to a fourteenth dielectric layer of the multilayer stack shown in FIG. 1.

FIG. 9 illustrates a patterned surface of each of the ninth to fourteenth dielectric layers 59 to 64. Six through holes 59T5 and thirty-three ground through holes are formed in each of the dielectric layers 59 to 64.

The six through holes 58T5 shown in FIG. 8 are connected to the six through holes 59T5 formed in the ninth dielectric layer 59. The thirty-three ground through holes shown in FIG. 8 are connected to the thirty-three ground through holes formed in the ninth dielectric layer 59. In the dielectric layers 58 to 64, every vertically adjacent through holes are connected to each other.

Figure 10:
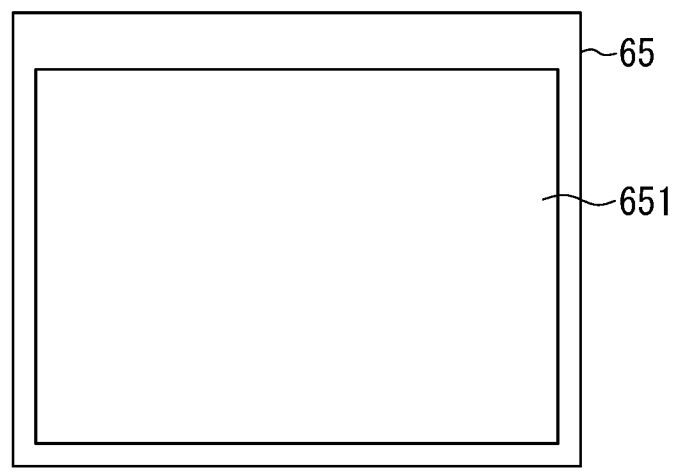
FIG. 10 is an explanatory diagram illustrating a patterned surface of a fifteenth dielectric layer of the multilayer stack shown in FIG. 1.

FIG. 10 illustrates a patterned surface of the fifteenth dielectric layer 65. A ground conductor layer 651 is formed on the dielectric layer 65. The six through holes 59T5 and the thirty-three ground through holes formed in the fourteenth dielectric layer 64 (see FIG. 9) are connected to the ground conductor layer 651.

Although not illustrated, a conductor layer to be used as a mark is formed on the patterned surface of the sixteenth dielectric layer.

The multilayer stack 50 is formed by stacking the first to fifteenth dielectric layers 51 to 65 and the sixteenth dielectric layer such that the patterned surface of the first dielectric layer 51 serves as the bottom surface 50A. A surface of the sixteenth dielectric layer opposite to the patterned surface serves as the top surface 50B of the multilayer stack 50.

Correspondences between the circuit components of the multilayer electronic component 1 shown in FIG. 2 and the components of the multilayer stack 50 shown in FIG. 3 to FIG. 10 will now be described.

First, a description will be given of the first band elimination filter 20A. The capacitor 27A is composed of the conductor layer 521 shown in FIG. 4, the capacitor-forming portion 531C of the conductor layer 531 shown in FIG. 5, and the dielectric layer 52 interposed therebetween. The conductor layer 521 is connected to the first input/output terminal 11 via the through hole 51T1.

The first conductor line 23A of the resonator 22A is composed of the resonator-forming portion 531R of the conductor layer 531 shown in FIG. 5. The first end of the resonator-forming portion 531R is connected to the capacitor-forming portion 531C. The portion of the resonator-forming portion 531R near the second end thereof is connected to the ground conductor layer 13 of FIG. 3 via the through hole 52T3, the conductor layer 523 and the through hole 51T3.

The through hole line section 26A is composed of the through holes 52T1 and 53T1, the three through holes 54T1 formed in the dielectric layers 54 to 56, the conductor layer 571, and the through hole 57T1. The through holes 52T1 and 53T1 and the three through holes 54T1 are arranged such that their central axes are collinear, thereby constituting a through hole string 26AT shown in FIG. 1. The through hole 52T1 is connected to the conductor layer 521 constituting the capacitor 27A.

The connection point between the through hole 51T1 and the first input/output terminal 11 shown in FIG. 3 corresponds to the first input/output end 20Aa shown in FIG. 2.

The second conductor line 25A is composed of the conductor layer 581 shown in FIG. 8. The portion of the conductor layer 581 near the first end 581a thereof is connected to the through hole 57T1 located at an end of the through hole line section 26A.

The portion of the conductor layer 581 near the second end 581b thereof corresponds to the second input/output end 20Ab shown in FIG. 2.

Next, the second band elimination filter 20B will be described. The capacitor 27B is composed of the conductor layer 522 shown in FIG. 4, the capacitor-forming portion 532C of the conductor layer 532 shown in FIG. 5, and the dielectric layer 52 interposed therebetween. The conductor layer 522 is connected to the second input/output terminal 12 via the through hole 51T2.

The first conductor line 23B of the resonator 22B is composed of the resonator-forming portion 532R of the conductor layer 532 shown in FIG. 5. The first end of the resonator-forming portion 532R is connected to the capacitor-forming portion 532C. The portion of the resonator-forming portion 532R near the second end thereof is connected to the ground conductor layer 13 of FIG. 3 via the through hole 52T4, the conductor layer 524 and the through hole 51T4.

The through hole line section 26B is composed of the through holes 52T2 and 53T2, the three through holes 54T2 formed in the dielectric layers 54 to 56, the conductor layer 572, and the through hole 57T2. The through holes 52T2 and 53T2 and the three through holes 54T2 are arranged such that their central axes are collinear, thereby constituting a through hole string 26BT shown in FIG. 1. The through hole 52T2 is connected to the conductor layer 522 constituting the capacitor 27B.

The connection point between the through hole 51T2 and the second input/output terminal 12 shown in FIG. 3 corresponds to the first input/output end 20Ba shown in FIG. 2.

The second conductor line 25B is composed of the conductor layer 582 shown in FIG. 8. The portion of the conductor layer 582 near the first end 582a thereof is connected to the through hole 57T2 located at an end of the through hole line section 26B.

The portion of the conductor layer 582 near the second end 582b thereof corresponds to the second input/output end 20Bb shown in FIG. 2.

Next, the filter section 30 will be described. The resonator 31 is composed of the resonator-forming portion 583A of the conductor layer 583 shown in FIG. 8. The resonator 32 is composed of the resonator-forming portion 583B of the conductor layer 583. The inductor 35 is composed of the coupling portion 583C of the conductor layer 583 and the through holes 51T5, 52T5, 53T5, 54T5, 57T5, 58T5 and 59T5.

A portion of the conductor layer 573 shown in FIG. 7 is opposed to the portion of the conductor layer 581 near the second end 581b thereof (see FIG. 8) with the dielectric layer 57 interposed therebetween. Another portion of the conductor layer 573 is opposed to a portion of the resonator-forming portion 583A with the dielectric layer 57 interposed therebetween. The capacitor 33 is thereby formed.

A portion of the conductor layer 574 shown in FIG. 7 is opposed to the portion of the conductor layer 582 near the second end 582b thereof (see FIG. 8) with the dielectric layer 57 interposed therebetween. Another portion of the conductor layer 574 is opposed to a portion of the resonator-forming portion 583B with the dielectric layer 57 interposed therebetween. The capacitor 34 is thereby formed.

The ground conductor layers 13 and 651 are electrically connected to the plurality of ground through holes to constitute a ground section. The first conductor lines 23A and 23B, the second conductor lines 25A and 25B, and the resonators 31 and 32 are surrounded by the ground section. The first distributed constant line in the first band elimination filter 20A is composed of the first conductor line 23A and the ground section. The second distributed constant line in the first band elimination filter 20A is composed of the second conductor line 25A and the ground section. The first distributed constant line in the second band elimination filter 20B is composed of the first conductor line 23B and the ground section. The second distributed constant line in the second band elimination filter 20B is composed of the second conductor line 25B and the ground section.

Now, the operation and effects of the multilayer electronic component 1 according to the present embodiment will be described. The multilayer electronic component 1 includes the first band elimination filter 20A, the second band elimination filter 20B, and the filter section 30, which is a band pass filter. In circuit configuration, the first band elimination filter 20A is located between the first input/output terminal 11 and the filter section 30, and the second band elimination filter 20B is located between the second input/output terminal 12 and the filter section 30.

The passband of the filter section 30, the stopband of the first band elimination filter 20A, and the stopband of the second band elimination filter 20B are all in the quasi-millimeter wave band of 10 to 30 GHz or the millimeter wave band of 30 to 300 GHz. Both the stopband of the first band elimination filter 20A and the stopband of the second band elimination filter 30B are in a frequency region higher than the passband of the filter section 30. The multilayer electronic component 1 according to the present embodiment makes it possible to implement a band pass filter having better attenuation characteristic in a stopband higher than the passband, when compared with a case without the first and second band elimination filters 20A and 20B.

In the first band elimination filter 20A, the resonator 22A includes the first conductor line 23A constituting a first distributed constant line, and the impedance transformer 24A includes the second conductor line 25A constituting a second distributed constant line. Likewise, in the second band elimination filter 20B, the resonator 22B includes the first conductor line 23B constituting a first distributed constant line, and the impedance transformer 24B includes the second conductor line 25B constituting a second distributed constant line. The conductor lines 23A, 25A, 23B and 25B can be fabricated using the multilayer stack 50 with higher precision as compared with a spiral-shaped inductor that may be used for an LC circuit. The present embodiment thus enables reduction or elimination of characteristic variations of the first and second band elimination filters 20A and 20B.

The impedance transformer 24A includes, in addition to the second conductor line 25A, the through hole line section 26A connected in series to the second conductor line 25A. The through hole line section 26A includes at least one through hole provided in the multilayer stack 50. The impedance transformer 24B includes, in addition to the second conductor line 25B, the through hole line section 26B connected in series to the second conductor line 25B. The through hole line section 26B includes at least one through hole provided in the multilayer stack 50. According to the present embodiment, the impedance transformers 24A and 24B can be easily designed and fabricated by utilizing the structural features of the multilayer stack 50 including a plurality of through holes.

When implementing a band elimination filter having a stopband in a quasi-millimeter or millimeter wave band with an LC circuit formed using a multilayer stack, a stray capacitance occurs noticeably between a conductor layer forming an inductor and another conductor layer. Thus, the characteristic of an actually fabricated inductor may greatly differ from the characteristic of the inductor designed as a lumped constant element. As a result, an actually fabricated band elimination filter may have a characteristic greatly different from that as designed.

To cope with this, in the present embodiment, the resonator 22A and the impedance transformer 24A are designed in consideration of capacitances to be distributed along the first and second conductor lines 23A and 25A. Likewise, the resonator 22B and the impedance transformer 24B are designed in consideration of capacitances to be distributed along the first and second conductor lines 23B and 25B. The present embodiment thus prevents the characteristics of actually fabricated band elimination filters 20A and 20B from greatly differing from those of the band elimination filters 20A and 20B as designed.

By virtue of the foregoing, the present embodiment enables easy implementation of the band elimination filters 20A and 20B which are formed using the multilayer stack 50 and have stopbands in a quasi-millimeter or millimeter wave band.

Further, the present embodiment enables downsizing of the multilayer stack 50 relative to the case where the impedance transformers 24A and 24B are configured without through holes.

Figure 11:
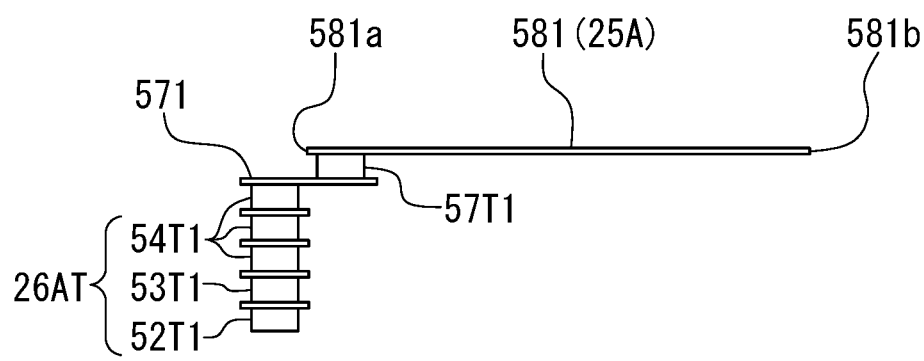
FIG. 11 is a side view illustrating a first example of the structure of an impedance transformer of the first embodiment of the invention.
Figure 12:
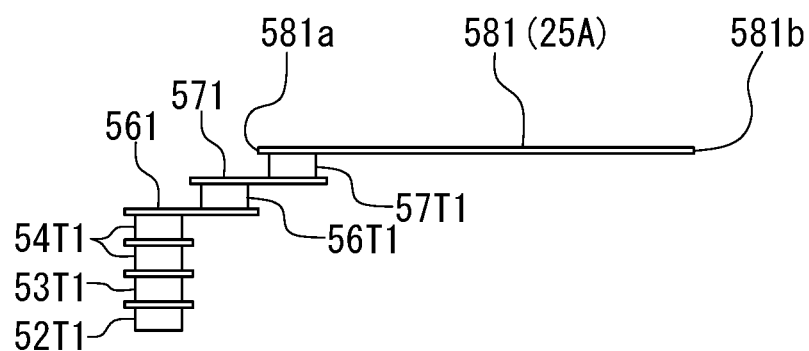
FIG. 12 is a side view illustrating a second example of the structure of the impedance transformer of the first embodiment of the invention.
Figure 13:
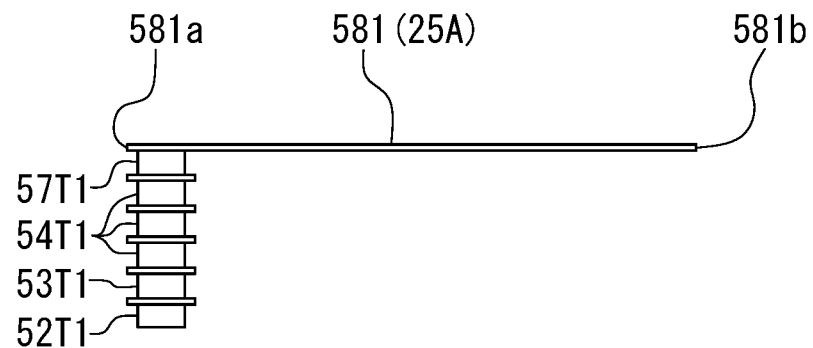
FIG. 13 is a side view illustrating a third example of the structure of the impedance transformer of the first embodiment of the invention.

According to the present embodiment, the impedance transformer 24A includes the second conductor line 25A and the through hole line section 26A, and the impedance transformer 24B includes the second conductor line 25B and the through hole line section 26B. This facilitates adjustment of the length of the shortest current path in each of the impedance transformers 24A and 24B. This will be described with reference to FIG. 11 to FIG. 13. FIG. 11 to FIG. 13 are side views illustrating first to third examples of the structure of the impedance transformer 24A, respectively.

In the first example shown in FIG. 11, the through holes 52T1, 53T1, 54T1 and 57T1 and the conductor layers 571 and 581 are arranged as shown in FIG. 4 to FIG. 8 In the first example, the through holes 52T1 and 53T1 and the three through holes 54T1 are arranged such that their central axes are collinear. The through hole 57T1 is arranged such that its central axis is not collinear with the central axes of the through holes 52T1 and 53T1 and the three through holes 54T1. The central axis of the through hole 57T1 is closer to the second end 581$b$ of the conductor layer 581 than are the central axes of the through holes 52T1 and 53T1 and the three through holes 54T1.

In the second example shown in FIG. 12, a conductor layer 561 is provided on the patterned surface of the sixth dielectric layer 56. Further, in the dielectric layer 56, a through hole 56T1 connected to the conductor layer 561 is formed instead of the through hole 54T1. The through hole 56T1 is connected to the conductor layer 571. The through hole 54T1 formed in the fifth dielectric layer 55 is connected to the conductor layer 561.

In the second example, the through holes 52T1 and 53T1 and the two through holes 54T1 are arranged such that their central axes are collinear. Further, in the second example, the central axis of the through hole 57T1 is closer to the second end 581$b$ of the conductor layer 581 than in the first example. The central axis of the through hole 56T1 is closer to the second end 581$b$ of the conductor layer 581 than are the central axes of the through holes 52T1 and 53T1 and the two through holes 54T1, and is farther from the second end 581$b$ of the conductor layer 581 than is the central axis of the through hole 57T1. Further, in the second example, the conductor layer 581 is shorter than in the first example.

In the third example shown in FIG. 13, the conductor layer 571 is not provided and the through holes 52T1, 53T1, 54T1 and 57T1 constituting the through hole line section 26A are arranged such that all their central axes are collinear. Further, in the third example, the conductor layer 581 is longer than in the first example.

In the first to third examples, the position of the through hole 52T1 at one end of the impedance transformer 24A and the position of the second end 581$b$ of the conductor layer 581 at the other end of the impedance transformer 24A remain unchanged.

The length of the shortest current path in the impedance transformer 24A is shorter in the second example than in the first example, and is longer in the third example than in the first example.

As can be seen from the first to third examples, according to the present embodiment, the length of the shortest current path in the impedance transformer 24A can be adjusted easily by changing the position of at least one of the plurality of through holes constituting the through hole line section 26A, without necessitating changes in the physical position of opposite ends of the impedance transformer 24A. As result, according to the present embodiment, the characteristic of the impedance transformer 24A can be adjusted easily by a slight design modification. The same holds true for the impedance transformer 24B.

Figure 14:
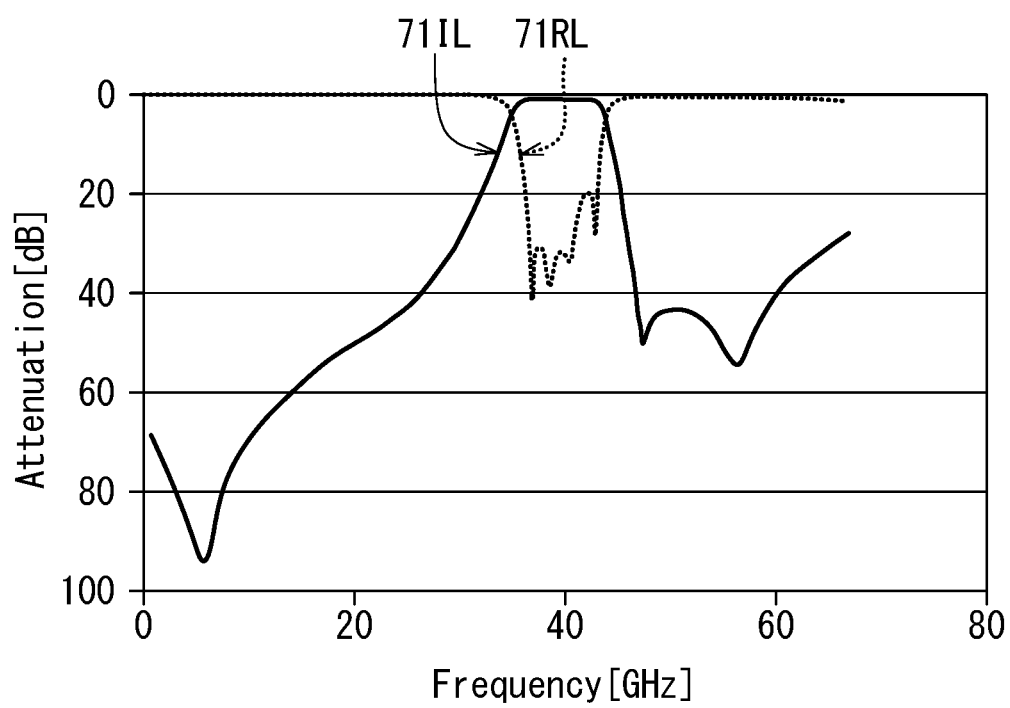
FIG. 14 is a characteristic diagram illustrating the characteristic of the multilayer electronic component according to the first embodiment of the invention.

An example of characteristics of the multilayer electronic component 1 will now be described. FIG. 14 illustrates an example of characteristics of the multilayer electronic component 1, more specifically, the frequency responses of the insertion loss and return loss of the multilayer electronic component 1. Hereinafter, the insertion loss and return loss values will be collectively referred to as "attenuation". In FIG. 14, the horizontal axis represents frequency, and the vertical axis represents attenuation. In FIG. 14, the curve 71IL represents the frequency response of the insertion loss, and the curve 71RL represents the frequency response of the return loss.

Figure 15:
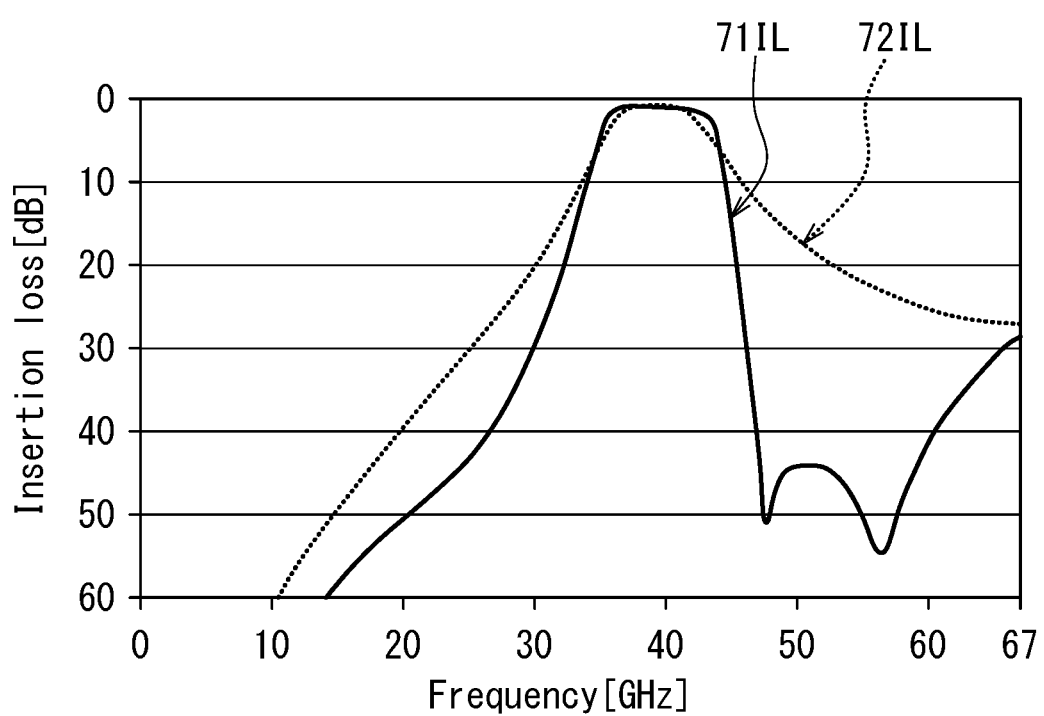
FIG. 15 is a characteristic diagram illustrating the characteristics of the multilayer electronic component and a filter section in the multilayer electronic component according to the first embodiment of the invention.

FIG. 15 illustrates the characteristics of the multilayer electronic component 1 and the filter section 30 in the multilayer electronic component 1. In FIG. 15, the horizontal axis represents frequency, and the vertical axis represents insertion loss. In FIG. 15, the curve 71IL represents the frequency response of the insertion loss of the multilayer electronic component 1, and the curve 72IL represents the frequency response of the insertion loss of the filter section 30.

As can be seen from FIG. 15, the multilayer electronic component 1 according to the present embodiment makes it possible to implement a band pass filter having better attenuation characteristic in a stopband higher than the passband, when compared with a case without the first and second band elimination filters 20A and 20B.

Second Embodiment

Figure 16:
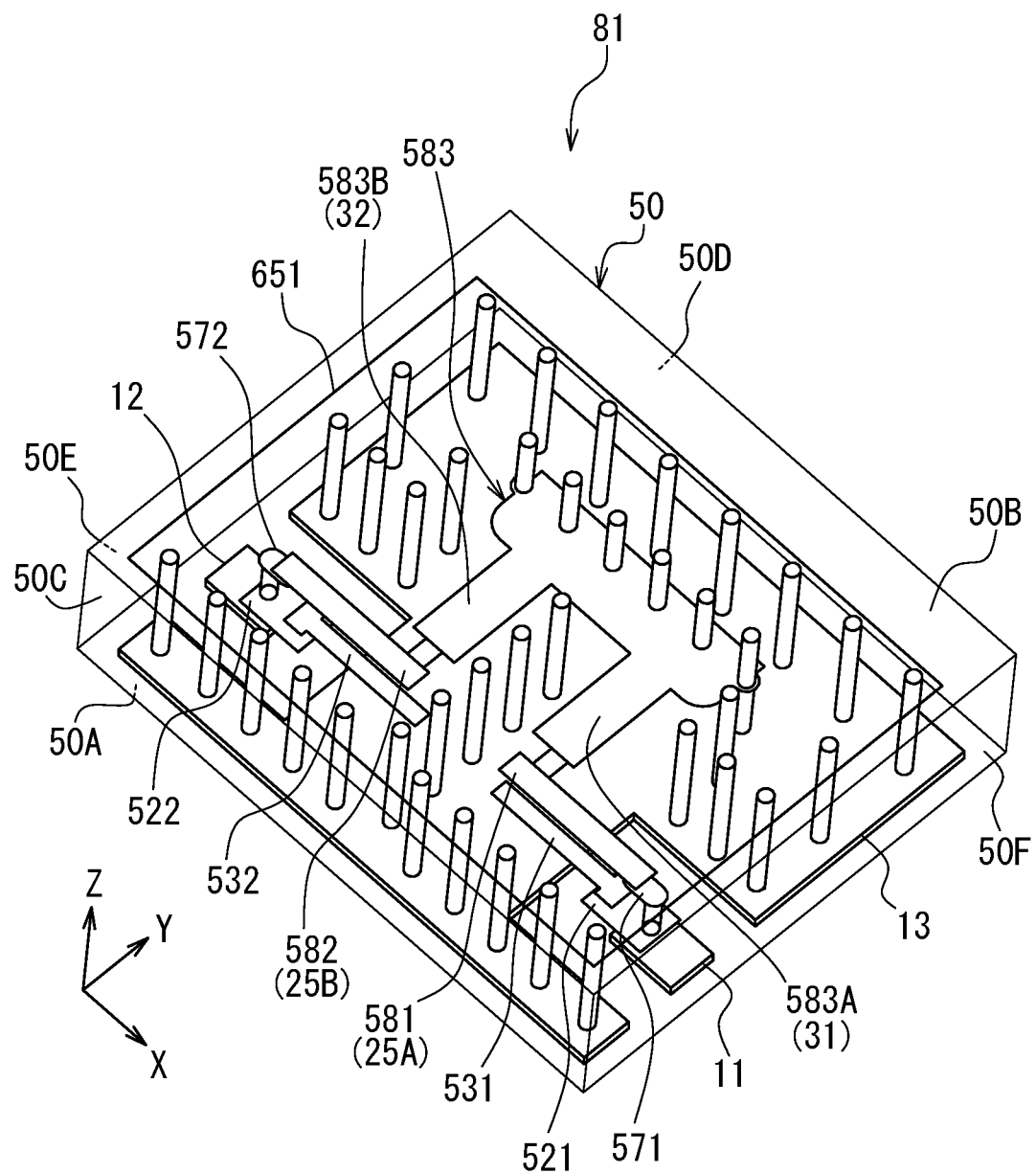
FIG. 16 is a perspective view illustrating the structure of a multilayer electronic component according to a second embodiment of the invention.
Figure 17:
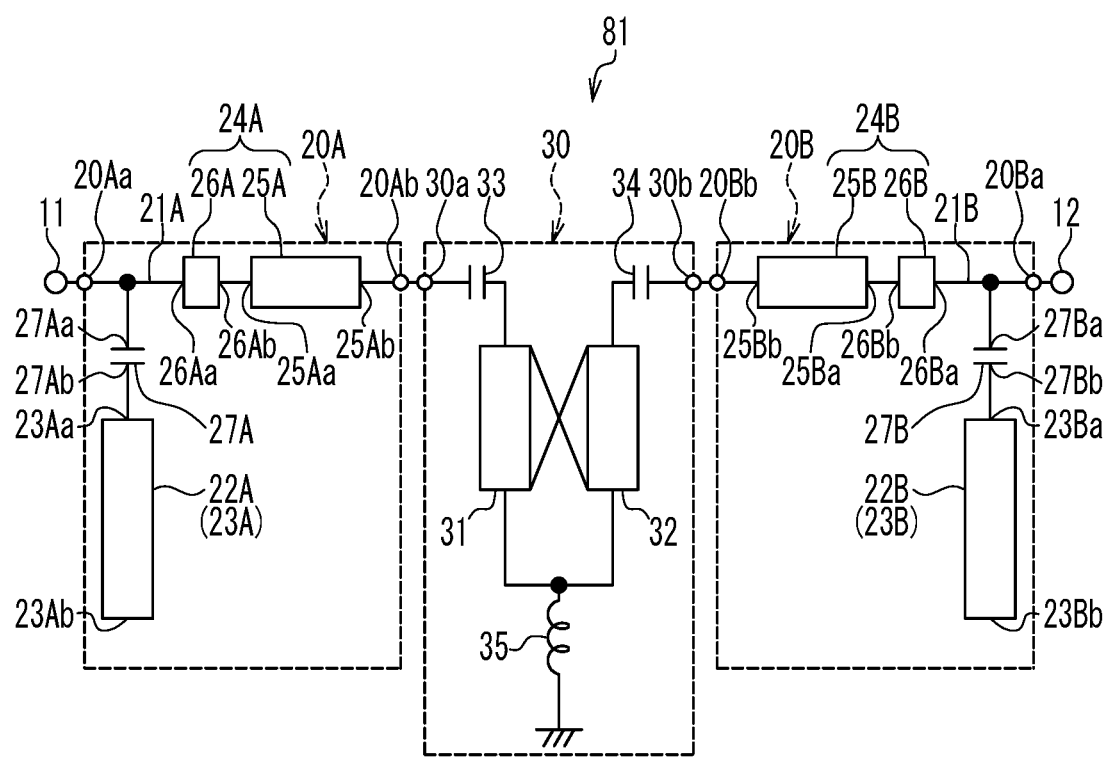
FIG. 17 is a circuit diagram illustrating the circuit configuration of the multilayer electronic component according to the second embodiment of the invention.

A multilayer electronic component according to a second embodiment of the invention will now be described. FIG. 16 is a perspective view illustrating the structure of the multilayer electronic component 81 according to the second embodiment. FIG. 17 is a circuit diagram illustrating the circuit configuration of the multilayer electronic component 81 according to the second embodiment.

The multilayer electronic component 81 according to the present embodiment differs from the multilayer electronic component 1 according to the first embodiment in the following ways. In the electronic component 81, both the resonators 22A and 22B are half-wave resonators. Each of the second end 23Ab of the first conductor line 23A and the second end 23Bb of the first conductor line 23B is open and not connected to the ground.

The resonant frequency of the resonator 22A is the same or nearly the same as the center frequency of the stopband of the first band elimination filter 20A. The resonant frequency of the resonator 22B is the same or nearly the same as the center frequency of the stopband of the second band elimination filter 20B.

The resonant frequency of the resonator 22A is determined in consideration of the capacitance of the capacitor 27A. In this case, given the same resonant frequency, the length of the first conductor line 23A is smaller than in the case without the capacitor 27A. Consequently, the length of the first conductor line 23A is smaller than a half of the wavelength corresponding to the center frequency of the stopband of the first band elimination filter 20A.

Likewise, the resonant frequency of the resonator 22B is determined in consideration of the capacitance of the capacitor 27B. In this case, given the same resonant frequency, the length of the first conductor line 23B is smaller than in the case without the capacitor 27B. Consequently, the length of the first conductor line 23B is smaller than a half of the wavelength corresponding to the center frequency of the stopband of the second band elimination filter 20B.

Reference is now made to FIG. 18 to FIG. 25 to describe a plurality of dielectric layers constituting the multilayer stack 50 of the present embodiment and the configuration of a plurality of conductor layers formed on the dielectric layers and a plurality of through holes formed in the dielectric layers. As in the first embodiment, the multilayer stack 50 includes the first to sixteenth dielectric layers.

Figure 18:
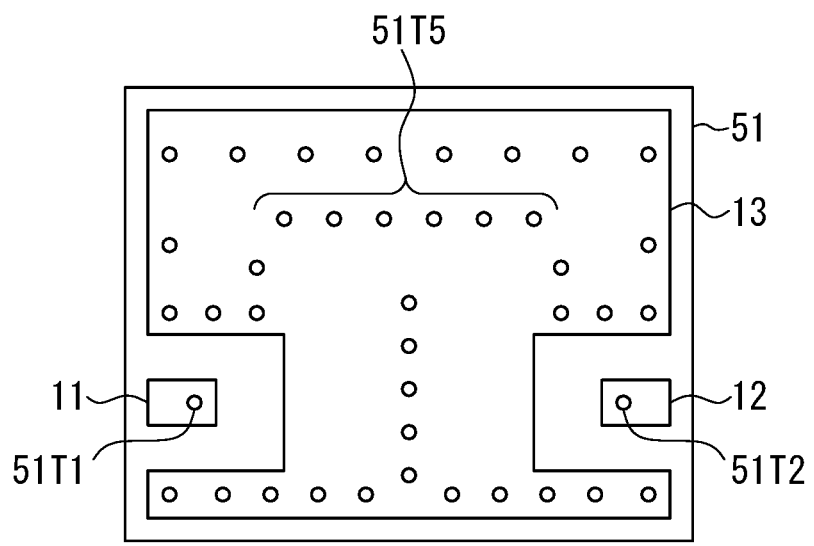
FIG. 18 is an explanatory diagram illustrating a patterned surface of a first dielectric layer of the multilayer stack shown in FIG. 16.

FIG. 18 illustrates a patterned surface of the first dielectric layer 51. The first input/output terminal 11, the second input/output terminal 12 and the ground conductor layer 13 are formed on the patterned surface of the dielectric layer 51, as in the first embodiment.

Further, formed in the dielectric layer 51 are a through hole 51T1 connected to the first input/output terminal 11, a through hole 51T2 connected to the second input/output terminal 12, and thirty-nine through holes connected to the ground conductor layer 13. The thirty-nine through holes connected to the ground conductor layer 13 are six through holes 51T5 included in the filter section 30, and thirty-three ground through holes. In FIG. 18, the thirty-three ground through holes are represented by unlabeled circles.

Figure 19:
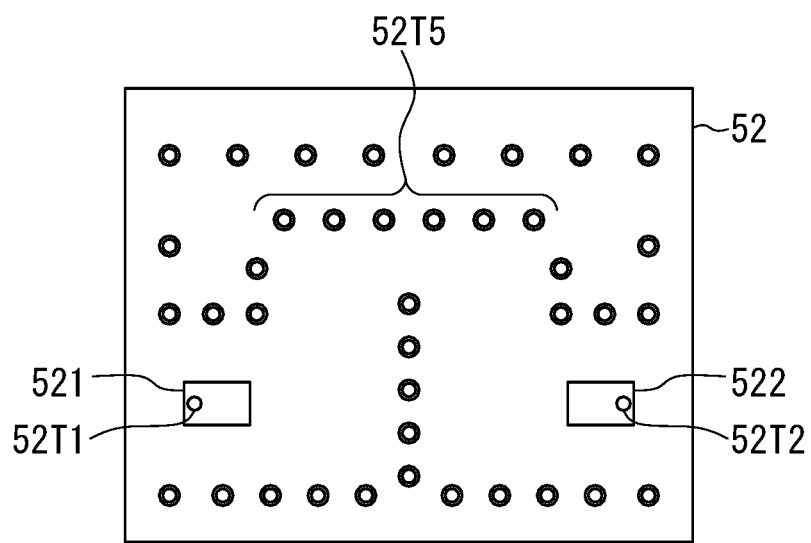
FIG. 19 is an explanatory diagram illustrating a patterned surface of a second dielectric layer of the multilayer stack shown in FIG. 16.

FIG. 19 illustrates a patterned surface of the second dielectric layer 52. Conductor layers 521 and 522 for capacitor(s) are formed on the patterned surface of the dielectric layer 52. The through holes 51T1 and 51T2 shown in FIG. 18 are connected to the conductor layers 521 and 522, respectively.

Further, formed in the dielectric layer 52 are through holes 52T1 and 52T2 for through hole line section(s). The through holes 52T1 and 52T2 are connected to the conductor layers 521 and 522, respectively.

Further, formed in the dielectric layer 52 are six through holes 52T5 connected to the six through holes 51T5 shown in FIG. 18, and thirty-three ground through holes connected to the thirty-three ground through holes shown in FIG. 18. In FIG. 19, the thirty-three ground through holes in the dielectric layer 52 are represented by unlabeled double circles. The same way of representation applies to FIG. 20 to FIG. 24.

Figure 20:
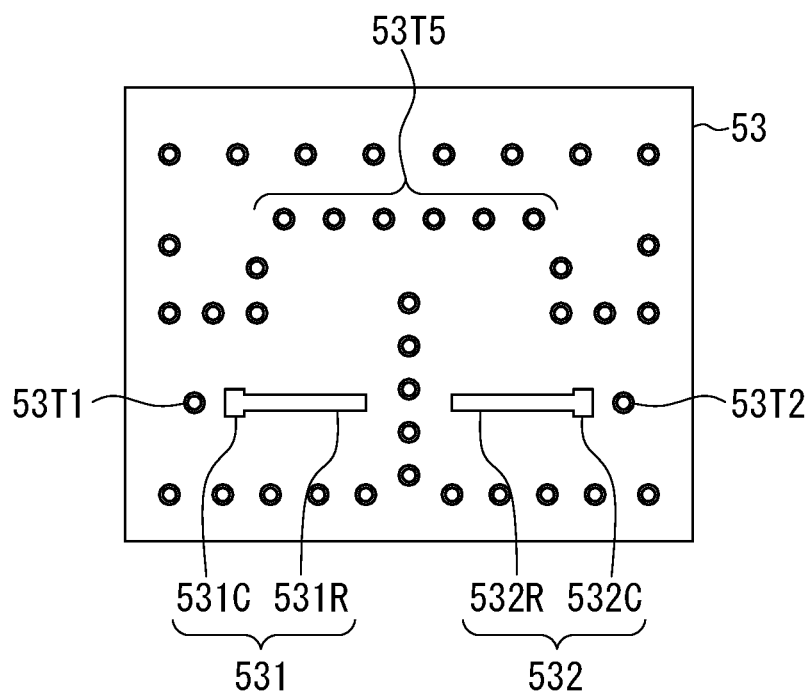
FIG. 20 is an explanatory diagram illustrating a patterned surface of a third dielectric layer of the multilayer stack shown in FIG. 16.

FIG. 20 illustrates a patterned surface of the third dielectric layer 53. Conductor layers 531 and 532 are formed on the patterned surface of the dielectric layer 53.

The conductor layer 531 includes a capacitor-forming portion 531C and a resonator-forming portion 531R. The capacitor-forming portion 531C is opposed to the conductor layer 521 shown in FIG. 19 with the dielectric layer 52 interposed therebetween. The resonator-forming portion 531R is shaped to be elongated in the X direction. The resonator-forming portion 531R has a first end and a second end opposite to each other in the X direction. The first end of the resonator-forming portion 531R is connected to the capacitor-forming portion 531C.

The conductor layer 532 includes a capacitor-forming portion 532C and a resonator-forming portion 532R. The capacitor-forming portion 532C is opposed to the conductor layer 522 shown in FIG. 19 with the dielectric layer 52 interposed therebetween. The resonator-forming portion 532R is shaped to be elongated in the X direction. The resonator-forming portion 532R has a first end and a second end opposite to each other in the X direction. The first end of the resonator-forming portion 532R is connected to the capacitor-forming portion 532C.

Further, formed in the dielectric layer 53 are through holes 53T1 and 53T2 for through hole line section(s). The through holes 52T1 and 52T2 shown in FIG. 19 are connected to the through holes 53T1 and 53T2, respectively.

Further, formed in the dielectric layer 53 are six through holes 53T5 connected to the six through holes 52T5 shown in FIG. 19, and thirty-three ground through holes connected to the thirty-three ground through holes shown in FIG. 19.

Figure 21:
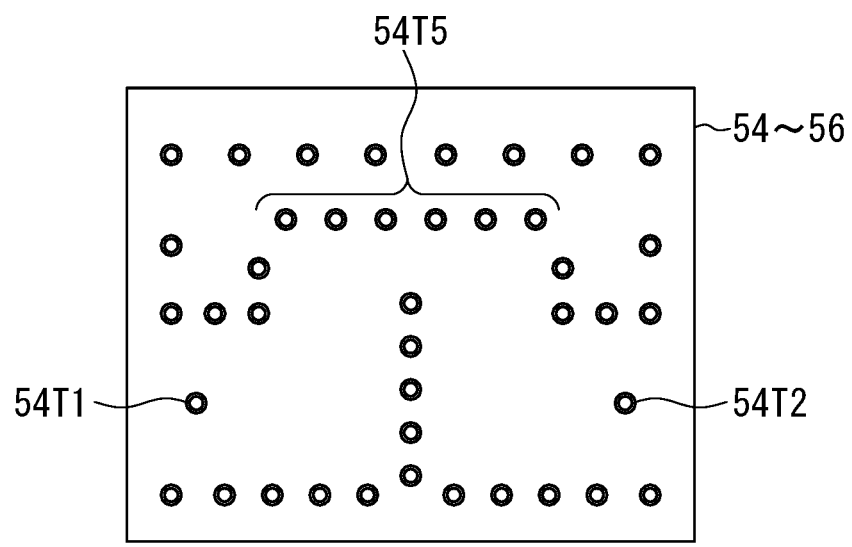
FIG. 21 is an explanatory diagram illustrating a patterned surface of each of a fourth to a sixth dielectric layer of the multilayer stack shown in FIG. 16.

FIG. 21 illustrates a patterned surface of each of the fourth to sixth dielectric layers 54 to 56. Through holes 54T1 and 54T2 for through hole line section(s), six through holes 54T5, and thirty-three ground through holes are formed in each of the dielectric layers 54 to 56.

The through holes 53T1 and 53T2 shown in FIG. 20 are respectively connected to the through holes 54T1 and 54T2 formed in the fourth dielectric layer 54. The six through holes 53T5 shown in FIG. 20 are connected to the six through holes 54T5 formed in the fourth dielectric layer 54. The thirty-three ground through holes shown in FIG. 20 are connected to the thirty-three ground through holes formed in the fourth dielectric layer 54. In the dielectric layers 54 to 56, every vertically adjacent through holes are connected to each other.

Figure 22:
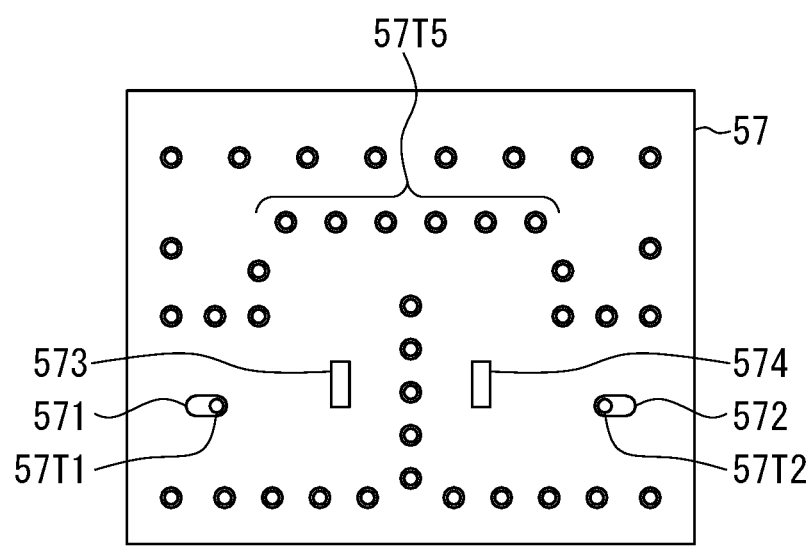
FIG. 22 is an explanatory diagram illustrating a patterned surface of a seventh dielectric layer of the multilayer stack shown in FIG. 16.

FIG. 22 illustrates a patterned surface of the seventh dielectric layer 57. On the patterned surface of the dielectric layer 57, there are formed conductor layers 571 and 572 for through hole line section(s) and conductor layers 573 and 574 for capacitor(s). The through holes 54T1 and 54T2 formed in the sixth dielectric layer 56 (see FIG. 21) are connected to the conductor layers 571 and 572, respectively.

Further, formed in the dielectric layer 57 are a through hole 57T1 connected to the conductor layer 571, a through hole 57T2 connected to the conductor layer 572, six through holes 57T5, and thirty-three ground through holes. The six through holes 54T5 formed in the sixth dielectric layer 56 (see FIG. 21) are connected to the six through holes 57T5. The thirty-three ground through holes formed in the sixth dielectric layer 56 (see FIG. 21) are connected to the thirty-three ground through holes formed in the dielectric layer 57.

Figure 23:
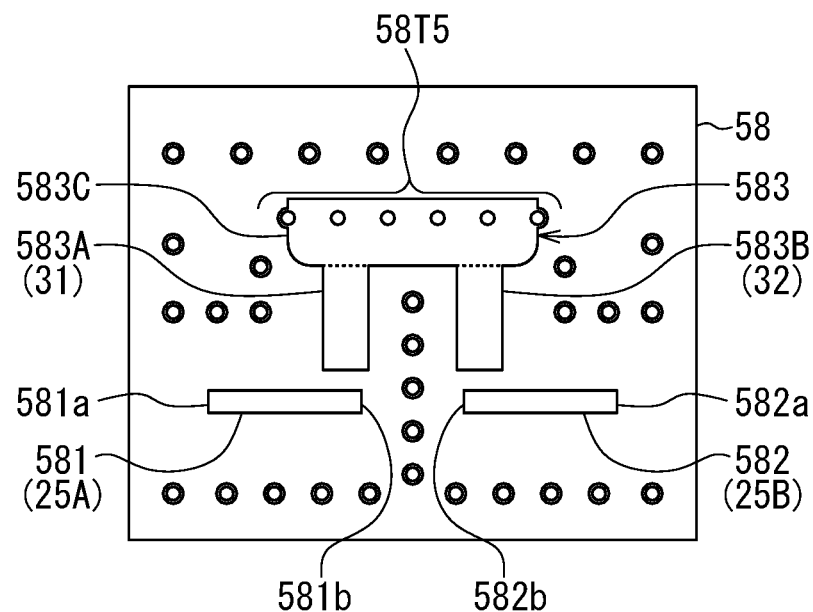
FIG. 23 is an explanatory diagram illustrating a patterned surface of an eighth dielectric layer of the multilayer stack shown in FIG. 16.

FIG. 23 illustrates a patterned surface of the eighth dielectric layer 58. Conductor layers 581, 582 and 583 which are the same as those in the first embodiment are formed on the patterned surface of the eighth dielectric layer 58.

The through hole 57T1 shown in FIG. 22 is connected to a portion of the conductor layer 581 near the first end 581a thereof. The through hole 57T2 shown in FIG. 22 is connected to a portion of the conductor layer 582 near the first end 582a thereof.

A portion of the conductor layer 573 shown in FIG. 22 is opposed to a portion of the conductor layer 581 near the second end 581b thereof with the dielectric layer 57 interposed therebetween. Another portion of the conductor layer 573 is opposed to a portion of the resonator-forming portion 583A with the dielectric layer 57 interposed therebetween.

A portion of the conductor layer 574 shown in FIG. 22 is opposed to a portion of the conductor layer 582 near the second end 582b thereof with the dielectric layer 57 interposed therebetween. Another portion of the conductor layer 574 is opposed to a portion of the resonator-forming portion 583B with the dielectric layer 57 interposed therebetween.

Further, formed in the dielectric layer 58 are six through holes 58T5 connected to the coupling portion 583C of the conductor layer 583, and thirty-three ground through holes. The six through holes 57T5 shown in FIG. 22 are connected to the six through holes 58T5. The thirty-three ground through holes formed in the dielectric layer 57 of FIG. 22 are connected to the thirty-three ground through holes formed in the dielectric layer 58.

Figure 24:
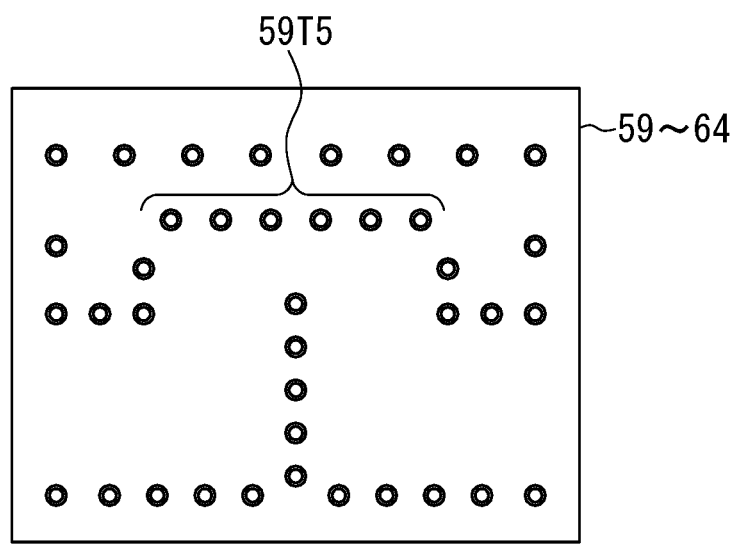
FIG. 24 is an explanatory diagram illustrating a patterned surface of each of a ninth to a fourteenth dielectric layer of the multilayer stack shown in FIG. 16.

FIG. 24 illustrates a patterned surface of each of the ninth to fourteenth dielectric layers 59 to 64. Six through holes 59T5 and thirty-three ground through holes are formed in each of the dielectric layers 59 to 64.

The six through holes 58T5 shown in FIG. 23 are connected to the six through holes 59T5 formed in the ninth dielectric layer 59. The thirty-three ground through holes shown in FIG. 23 are connected to the thirty-three ground through holes formed in the ninth dielectric layer 59. In the dielectric layers 58 to 64, every vertically adjacent through holes are connected to each other.

Figure 25:
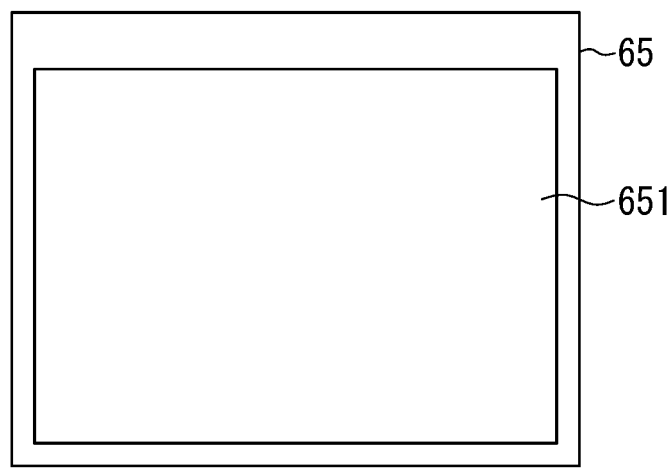
FIG. 25 is an explanatory diagram illustrating a patterned surface of a fifteenth dielectric layer of the multilayer stack shown in FIG. 16.

FIG. 25 illustrates a patterned surface of the fifteenth dielectric layer 65. A ground conductor layer 651 is formed on the dielectric layer 65. The six through holes 59T5 and the thirty-three ground through holes formed in the fourteenth dielectric layer 64 (see FIG. 24) are connected to the ground conductor layer 651.

Although not illustrated, a conductor layer to be used as a mark is formed on the patterned surface of the sixteenth dielectric layer.

The multilayer stack 50 is formed by stacking the first to fifteenth dielectric layers 51 to 65 and the sixteenth dielectric layer such that the patterned surface of the first dielectric layer 51 serves as the bottom surface 50A. A surface of the sixteenth dielectric layer opposite to the patterned surface serves as the top surface 50B of the multilayer stack 50.

The first conductor line 23A of the resonator 22A is composed of the resonator-forming portion 531R of the conductor layer 531 shown in FIG. 20. The first end of the resonator-forming portion 531R is connected to the capacitor-forming portion 531C. The second end of the resonator-forming portion 531R is open.

The first conductor line 23B of the resonator 22B is composed of the resonator-forming portion 532R of the conductor layer 532 shown in FIG. 20. The first end of the resonator-forming portion 532R is connected to the capacitor-forming portion 532C. The second end of the resonator-forming portion 532R is open.

The ground conductor layers 13 and 651 are electrically connected to the plurality of ground through holes to constitute a ground section. The first conductor lines 23A and 23B are surrounded by the ground section. The first distributed constant line in the first band elimination filter 20A is composed of the first conductor line 23A and the ground section. The first distributed constant line in the second band elimination filter 20B is composed of the first conductor line 23B and the ground section.

Figure 26:
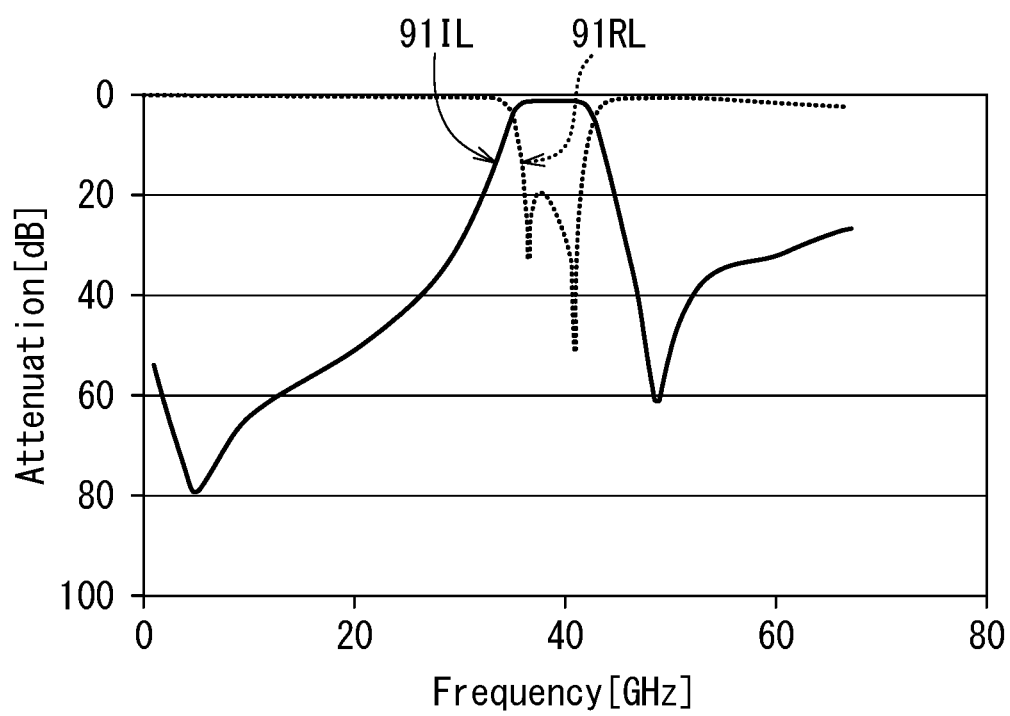
FIG. 26 is a characteristic diagram illustrating the characteristic of the multilayer electronic component according to the second embodiment of the invention.

An example of characteristics of the multilayer electronic component 81 will now be described. FIG. 26 illustrates an example of characteristics of the multilayer electronic component 81, more specifically, the frequency responses of the insertion loss and return loss of the multilayer electronic component 81. In FIG. 26, the horizontal axis represents frequency, and the vertical axis represents attenuation. In FIG. 26, the curve 911L represents the frequency response of the insertion loss, and the curve 91RL represents the frequency response of the return loss.

The other configuration, function, and effects of the present embodiment are the same as those of the first embodiment.

Third Embodiment

Figure 27:
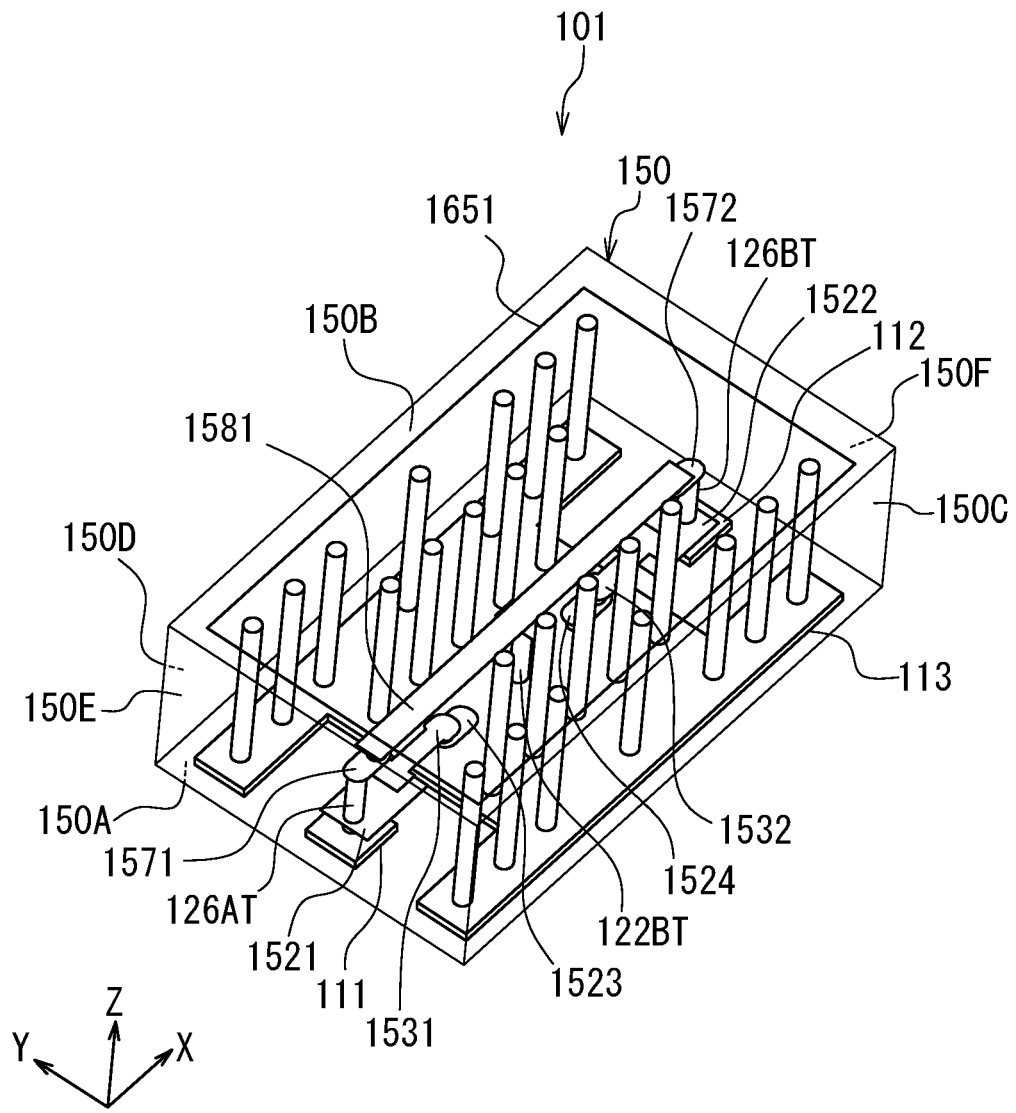
FIG. 27 is a perspective view illustrating the structure of a multilayer electronic component according to a third embodiment of the invention.
Figure 28:
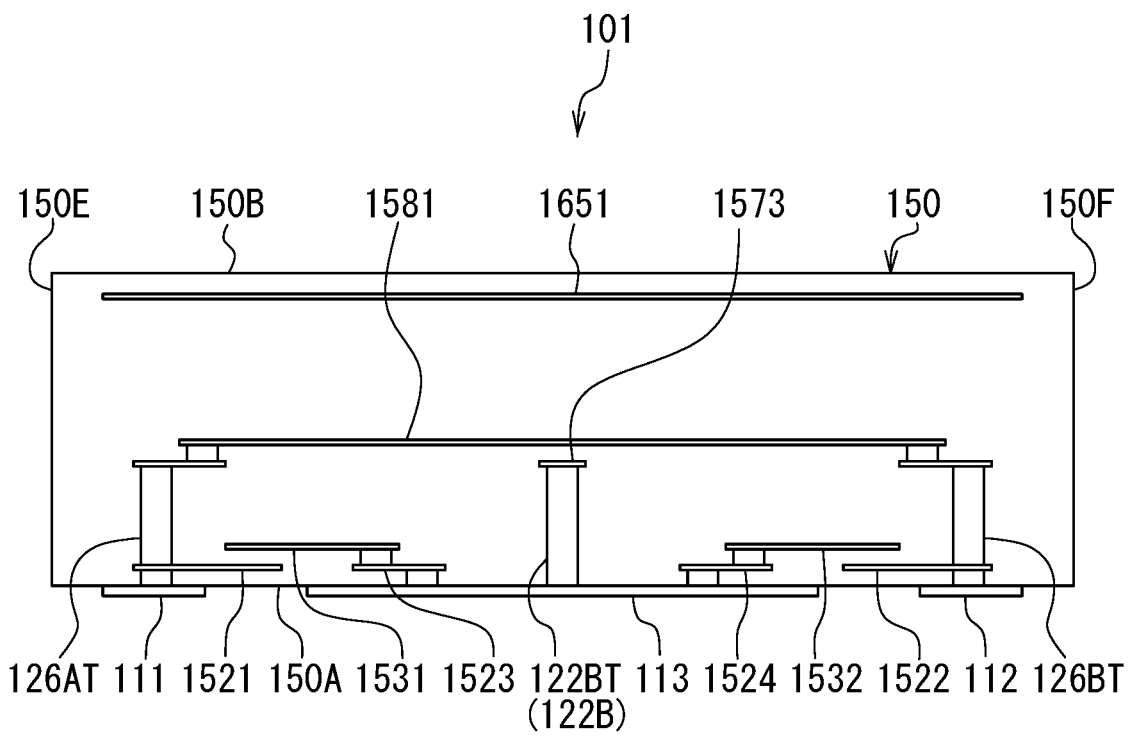
FIG. 28 is a cross-sectional view of the multilayer electronic component of FIG. 27.
Figure 29:
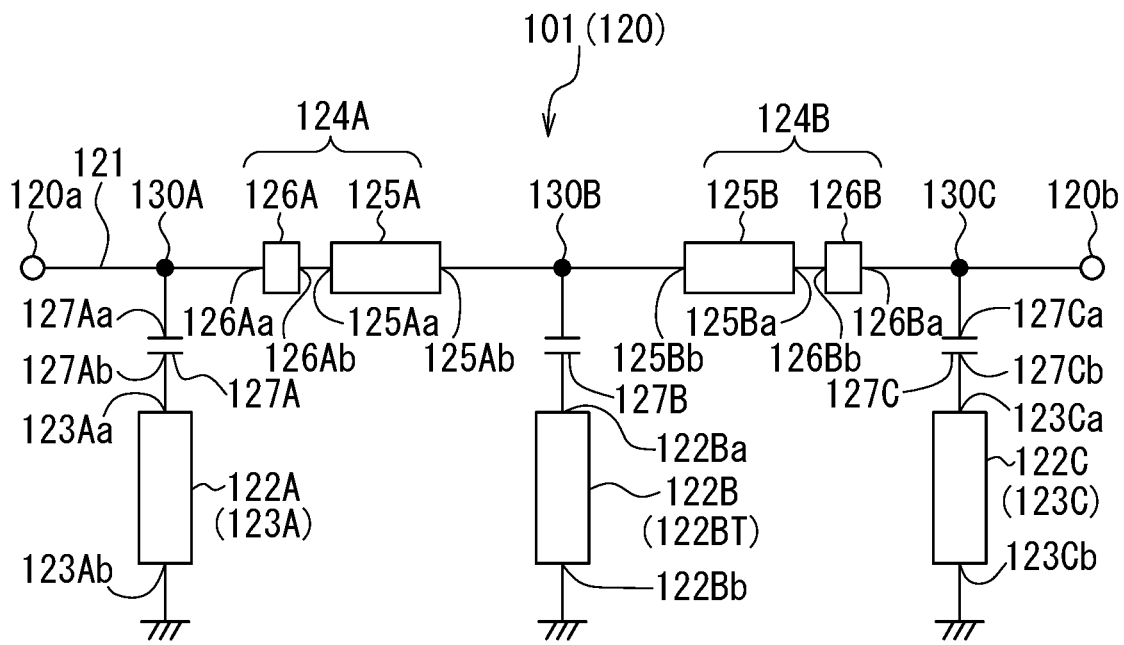
FIG. 29 is a circuit diagram illustrating the circuit configuration of the multilayer electronic component according to the third embodiment of the invention.

A multilayer electronic component according to a third embodiment of the invention will now be described. FIG. 27 is a perspective view illustrating the structure of the multilayer electronic component 101 according to the third embodiment. FIG. 28 is a cross-sectional view of the multilayer electronic component 101 of FIG. 27. FIG. 29 is a circuit diagram illustrating the circuit configuration of the multilayer electronic component 101 according to the third embodiment.

As shown in FIG. 27 and FIG. 28, the multilayer electronic component 101 according to the present embodiment includes a multilayer stack 150. As will be described in detail later, the multilayer stack 150 includes a plurality of dielectric layers and a plurality of conductor layers stacked together.

Here, X, Y and Z directions are defined as shown in FIG. 27. The X, Y and Z directions are orthogonal to one another. In the present embodiment, the Z direction is a direction parallel to the direction in which the plurality of dielectric layers are stacked.

The multilayer stack 150 is in the shape of a rectangular solid. The multilayer stack 150 has a top surface 150B and a bottom surface 150A located at opposite ends of the multilayer stack 150 in the Z direction, and four side surfaces 150C, 150D, 150E and 150F connecting the top surface 150B and the bottom surface 150A. The side surfaces 150C and 150D are located at opposite ends of the multilayer stack 150 in the Y direction. The side surfaces 150E and 150F are located at opposite ends of the multilayer stack 150 in the X direction.

The multilayer electronic component 101 has a first input/output terminal 111, a second input/output terminal 112 and a ground conductor layer 113 provided on the bottom surface 150A of the multilayer stack 150. The ground conductor layer 113 is connected to the ground.

The multilayer electronic component 101 includes a band elimination filter 120 formed using the multilayer stack 150. The multilayer electronic component 101 includes no filters other than the band elimination filter 120.

As shown in FIG. 29, the band elimination filter 120 has a first input/output end 120a, a second input/output end 120b, and a connection path 121 connecting the first input/output end 120a and the second input/output end 120b. The first input/output end 120a is formed of the first input/output terminal 111. The second input/output end 120b is formed of the second input/output terminal 112.

The band elimination filter 120 further includes a plurality of resonators coupled to the connection path 121. In the present embodiment, the band elimination filter 120 includes three resonators 122A, 122B and 122C, in particular. The three resonators 122A, 122B and 122C are coupled to the connection path 121 at connection points 130A, 130B and 130C, respectively. In circuit configuration, the connection point 130B is located between the connection points 130A and 130C.

The resonators 122A and 122C each correspond to the first resonator in the present invention. The resonator 122B corresponds to the second resonator in the present invention. The connection points 130A and 130C each correspond to the first point in the present invention. The connection point 130B corresponds to the second point in the present invention.

The band elimination filter 120 further includes a capacitor 127A for coupling the resonator 122A to the connection path 121, a capacitor 127B for coupling the resonator 122B to the connection path 121, and a capacitor 127C for coupling the resonator 122C to the connection path 121. The strengths of coupling of the resonators 122A, 122B and 1222C to the connection path 121 can be adjusted by adjusting the capacitances of the capacitors 127A, 127B and 127C, respectively.

The resonators 122A and 122C include first conductor lines 123A and 123C, respectively, each constituting a first distributed constant line. Each of the first conductor lines 123A and 123C is formed of at least one of the plurality of conductor layers of the multilayer stack 150.

The conductor line 123A has a first end 123Aa and a second end 123Ab, the first end 123Aa being closest to the connection path 121 in circuit configuration, the second end 123Ab being farthest from the connection path 121 in circuit configuration. The conductor line 123C has a first end 123Ca and a second end 123Cb, the first end 123Ca being closest to the connection path 121 in circuit configuration, the second end 123Cb being farthest from the connection path 121 in circuit configuration.

The capacitor 127A has a first end 127Aa and a second end 127Ab opposite to each other in circuit configuration. The first end 127Aa of the capacitor 127A is electrically connected to the connection point 130A of the connection path 121. The second end 127Ab of the capacitor 127A is electrically connected to the first end 123Aa of the conductor line 123A. The second end 123Ab of the conductor line 123A is connected to the ground.

The capacitor 127C has a first end 127Ca and a second end 127Cb opposite to each other in circuit configuration. The first end 127Ca of the capacitor 127C is electrically connected to the connection point 130C of the connection path 121. The second end 127Cb of the capacitor 127C is electrically connected to the first end 123Ca of the conductor line 123C. The second end 123Cb of the conductor line 123C is connected to the ground.

The resonator 122B is formed of a through hole string 122BT. The through hole string 122BT is composed of a plurality of through holes connected in series. The resonator 122B has a first end 122Ba and a second end 122Bb, the first end 122Ba being closest to the connection path 121 in circuit configuration, the second end 122Bb being farthest from the connection path 121 in circuit configuration. The capacitor 127B is provided between the first end 122Ba of the resonator 122B and the connection point 130B in circuit configuration. The second end 122Bb of the resonator 122B is connected to the ground.

The connection path 121 includes two impedance transformers 124A and 124B. The impedance transformer 124A is located between the connection points 130A and 130B in circuit configuration. The impedance transformer 124B is located between the connection points 130B and 130C in circuit configuration.

The impedance transformer 124A includes a second conductor line 125A constituting a second distributed constant line, and a through hole line section 126A connected in series to the second conductor line 125A. The impedance transformer 124B includes a second conductor line 125B constituting a second distributed constant line, and a through hole line section 126B connected in series to the second conductor line 125B.

Each of the second conductor lines 125A and 125B is formed of at least one of the plurality of conductor layers of the multilayer stack 150. Each of the through hole line sections 126A and 126B includes at least one through hole provided in the multilayer stack 150.

The first end 127Aa of the capacitor 127A and the first end 126Aa of the through hole line section 126A are electrically connected to the first input/output end 120a. The second end 126Ab of the through hole line section 126A is electrically connected to the first end 125Aa of the second conductor line 125A. The second end 125Ab of the second conductor line 125A is electrically connected to the connection point 130B.

The first end 127Ba of the capacitor 127B and the first end 126Ba of the through hole line section 126B are electrically connected to the second input/output end 120b. The second end 126Bb of the through hole line section 126B is electrically connected to the first end 125Ba of the second conductor line 125B. The second end 125Bb of the second conductor line 125B is electrically connected to the connection point 130B.

In the present embodiment, all the resonators 122A, 122B and 122C are quarter-wave resonators. The resonant frequency of each of the the resonators 122A, 122B and 122C is the same or nearly the same as the center frequency of the stopband of the band elimination filter 120. In the present embodiment, the stopband of the band elimination filter 120 is in a quasi-millimeter wave band of 10 to 30 GHz or a millimeter wave band of 30 to 300 GHz.

The resonant frequencies of the resonators 122A, 122B and 122C are determined in consideration of the capacitances of the capacitors 127A, 127B and 127C, respectively. In this case, given the same resonant frequency, the lengths of the first conductor lines 123A and 123C are smaller than in the case without the capacitors 127A and 127C. Consequently, the lengths of the first conductor lines 123A and 123C are each smaller than a quarter of the wavelength corresponding to the center frequency of the stopband of the band elimination filter 120. Further, given the same resonant frequency, the length of the through hole string 122BT is smaller than in the case without the capacitor 127B. Consequently, the length of the through hole string 122BT is smaller than a quarter of the wavelength corresponding to the center frequency of the stopband of the band elimination filter 120.

Reference is now made to FIG. 30 to FIG. 37 to describe a plurality of dielectric layers constituting the multilayer stack 150 and the configuration of a plurality of conductor layers formed on the dielectric layers and a plurality of through holes formed in the dielectric layers. The multilayer stack 150 includes sixteen dielectric layers stacked together. The sixteen dielectric layers will be referred to as the first to sixteenth dielectric layers in the order from bottom to top.

Figure 30:
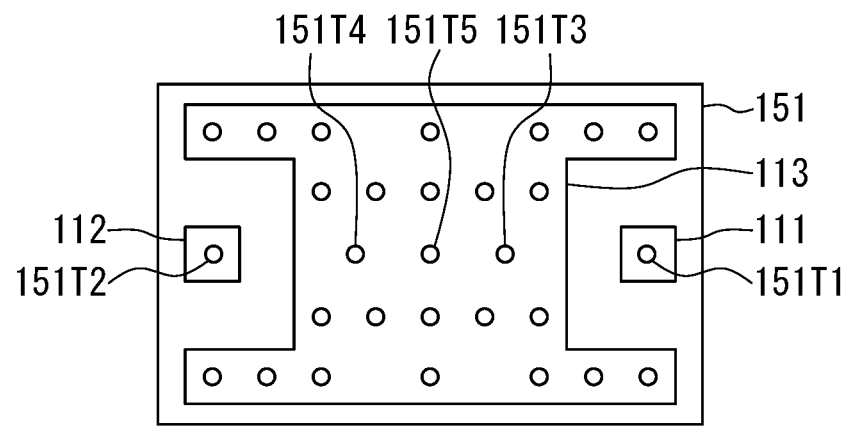
FIG. 30 is an explanatory diagram illustrating a patterned surface of a first dielectric layer of the multilayer stack shown in FIG. 27.

FIG. 30 illustrates a patterned surface of the first dielectric layer 151. The first input/output terminal 111, the second input/output terminal 112 and the ground conductor layer 113 are formed on the patterned surface of the dielectric layer 151.

Further, formed in the dielectric layer 151 are a through hole 151T1 connected to the first input/output terminal 111, a through hole 151T2 connected to the second input/output terminal 112, and twenty-seven through holes connected to the ground conductor layer 113. The twenty-seven through holes connected to the ground conductor layer 113 are through holes 151T3, 151T4 and 151T5, and twenty-four ground through holes. In FIG. 30, the twenty-four ground through holes are represented by unlabeled circles.

Figure 31:
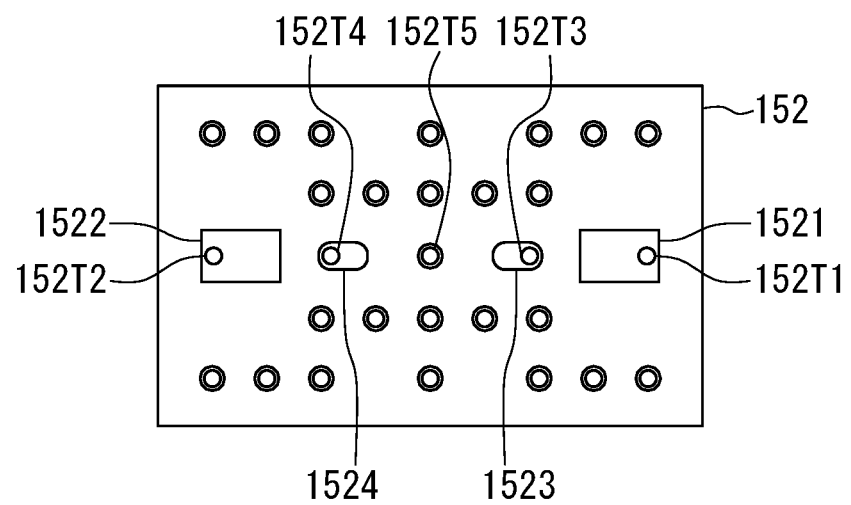
FIG. 31 is an explanatory diagram illustrating a patterned surface of a second dielectric layer of the multilayer stack shown in FIG. 27.

FIG. 31 illustrates a patterned surface of the second dielectric layer 152. On the patterned surface of the dielectric layer 152, there are formed conductor layers 1521 and 1522 for capacitor(s), and conductor layers 1523 and 1524. The through holes 151T1, 151T2, 151T3 and 151T4 shown in FIG. 30 are connected to the conductor layers 1521, 1522, 1523 and 1524, respectively.

Further, formed in the dielectric layer 152 are through holes 152T1 and 152T2 for through hole line section(s), and through holes 152T3, 152T4 and 152T5. The through holes 152T1, 152T2, 152T3 and 152T4 are connected to the conductor layers 1521, 1522, 1523 and 1524, respectively. The through hole 151T5 shown in FIG. 30 is connected to the through hole 152T5.

Further, formed in the dielectric layer 152 are twenty-four ground through holes connected to the twenty-four ground through holes shown in FIG. 30. In FIG. 31, the twenty-four ground through holes in the dielectric layer 152 are represented by unlabeled double circles. The same way of representation applies to FIG. 32 to FIG. 36.

Figure 32:
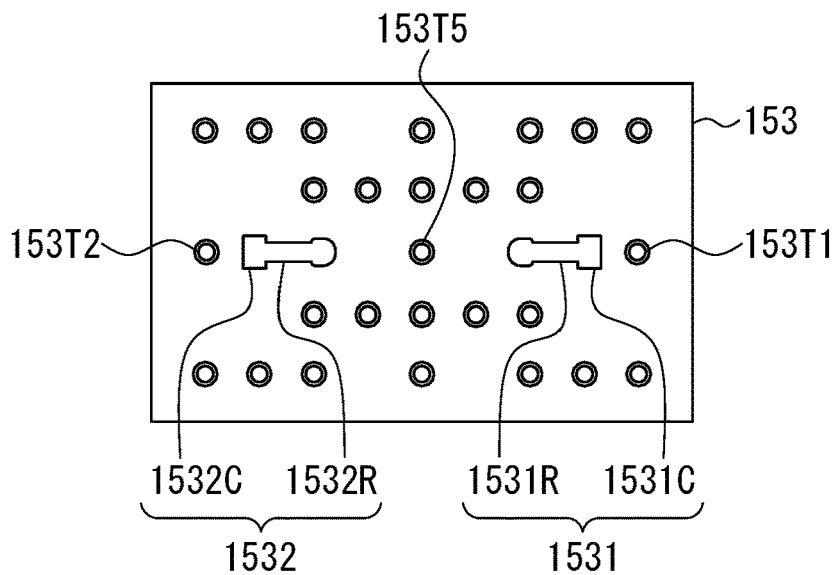
FIG. 32 is an explanatory diagram illustrating a patterned surface of a third dielectric layer of the multilayer stack shown in FIG. 27.

FIG. 32 illustrates a patterned surface of the third dielectric layer 153. Conductor layers 1531 and 1532 are formed on the patterned surface of the dielectric layer 153.

The conductor layer 1531 includes a capacitor-forming portion 1531C and a resonator-forming portion 1531R. The capacitor-forming portion 1531C is opposed to the conductor layer 1521 shown in FIG. 31 with the dielectric layer 152 interposed therebetween. The resonator-forming portion 1531R is shaped to be elongated in the X direction. The resonator-forming portion 1531R has a first end and a second end opposite to each other in the X direction. The first end of the resonator-forming portion 1531R is connected to the capacitor-forming portion 1531C. The through hole 152T3 shown in FIG. 31 is connected to a portion of the resonator-forming portion 1531R near the second end thereof.

The conductor layer 1532 includes a capacitor-forming portion 1532C and a resonator-forming portion 1532R. The capacitor-forming portion 1532C is opposed to the conductor layer 1522 shown in FIG. 31 with the dielectric layer 152 interposed therebetween. The resonator-forming portion 1532R is shaped to be elongated in the X direction. The resonator-forming portion 1532R has a first end and a second end opposite to each other in the X direction. The first end of the resonator-forming portion 1532R is connected to the capacitor-forming portion 1532C. The through hole 152T4 shown in FIG. 31 is connected to a portion of the resonator-forming portion 1532R near the second end thereof.

Further, through holes 153T1 and 153T2 for through hole line section(s) are formed in the dielectric layer 153. The through holes 152T1 and 152T2 shown in FIG. 31 are connected to the through holes 153T1 and 153T2, respectively.

Further, formed in the dielectric layer 153 are a through hole 153T5 connected to the through hole 152T5 shown in FIG. 31, and twenty-four ground through holes connected to the twenty-four ground through holes shown in FIG. 31.

Figure 33:
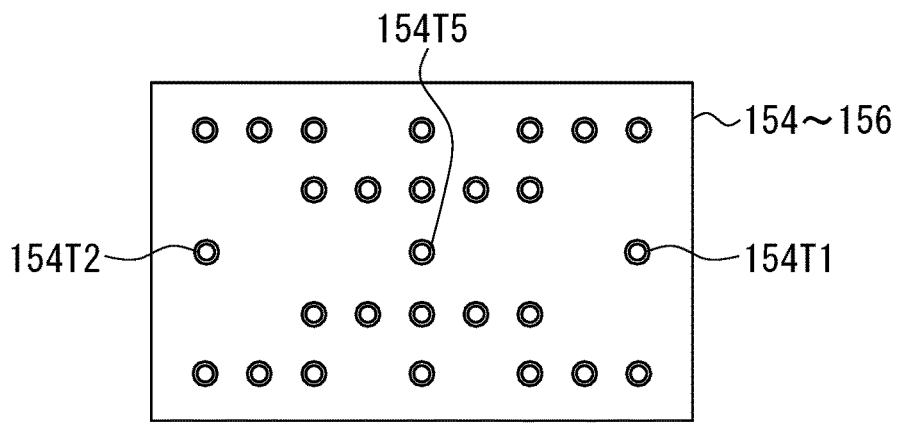
FIG. 33 is an explanatory diagram illustrating a patterned surface of each of a fourth to a sixth dielectric layer of the multilayer stack shown in FIG. 27.

FIG. 33 illustrates a patterned surface of each of the fourth to sixth dielectric layers 154 to 156. Through holes 154T1 and 154T2 for through hole line section(s), a through hole 154T5, and twenty-four ground through holes are formed in each of the dielectric layers 154 to 156.

The through holes 153T1, 153T2 and 153T5 shown in FIG. 32 are respectively connected to the through holes 154T1, 154T2 and 154T5 formed in the fourth dielectric layer 154. The twenty-four ground through holes shown in FIG. 32 are connected to the twenty-four ground through holes formed in the fourth dielectric layer 154. In the dielectric layers 154 to 156, every vertically adjacent through holes are connected to each other.

Figure 34:
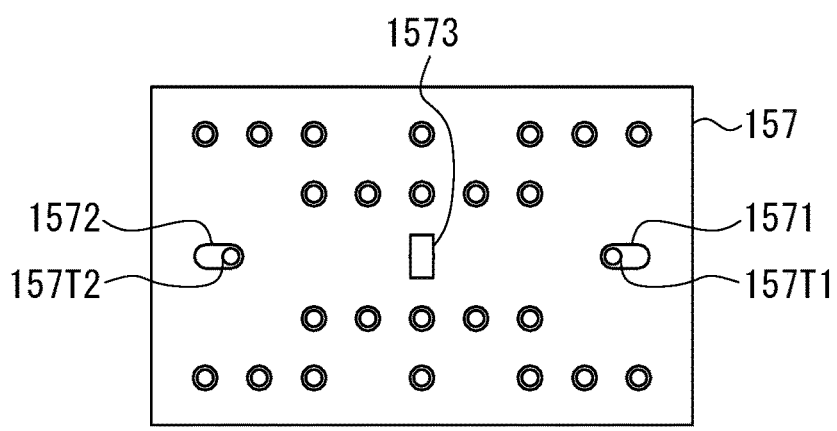
FIG. 34 is an explanatory diagram illustrating a patterned surface of a seventh dielectric layer of the multilayer stack shown in FIG. 27.

FIG. 34 illustrates a patterned surface of the seventh dielectric layer 157. On the patterned surface of the dielectric layer 157, there are formed conductor layers 1571 and 1572 for through hole line section(s) and a conductor layer 1573 for capacitor(s). The through holes 154T1, 154T2 and 154T5 formed in the sixth dielectric layer 156 (see FIG. 33) are connected to the conductor layers 1571, 1572 and 1573, respectively.

Further, formed in the dielectric layer 157 are a through hole 157T1 connected to the conductor layer 1571, a through hole 157T2 connected to the conductor layer 1572, and twenty-four ground through holes. The twenty-four ground through holes formed in the sixth dielectric layer 156 (see FIG. 33) are connected to the twenty-four ground through holes formed in the dielectric layer 157.

Figure 35:
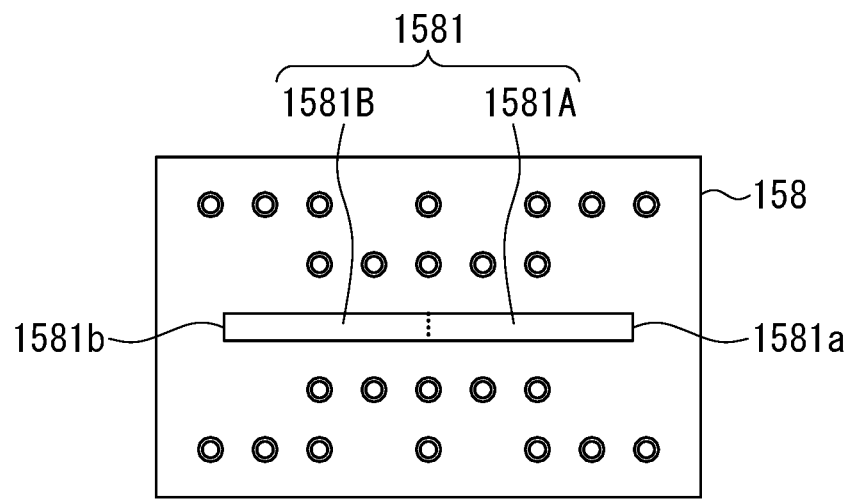
FIG. 35 is an explanatory diagram illustrating a patterned surface of an eighth dielectric layer of the multilayer stack shown in FIG. 27.

FIG. 35 illustrates a patterned surface of the eighth dielectric layer 158. A conductor layer 1581 is formed on the patterned surface of the dielectric layer 158. The conductor layer 1581 includes a line section 1581A constituting the second conductor line 125A, and a line section 1581B constituting the second conductor line 125B. In FIG. 35 the boundary between the line sections 1581A and 1581B is indicated by a dotted line.

Both the line sections 1581A and 1581B are shaped to be elongated in the X direction. The line section 1581A has a first end 1581a located at one end of the conductor layer 1581 in the X direction, and a second end opposite thereto. The line section 1581B has a first end 1581b located at the other end of the conductor layer 1581 in the X direction, and a second end opposite thereto. The second end of the line section 1581A and the second end of the line section 1581B are connected to each other.

The first end 1581a of the line section 1581A corresponds to the first end 125Aa of the second conductor line 125A. The second end of the line section 1581A corresponds to the second end 125Ab of the second conductor line 125A.

The first end 1581b of the line section 1581B corresponds to the first end 125Ba of the second conductor line 125B. The second end of the line section 1581B corresponds to the second end 125Bb of the second conductor line 125B.

The through hole 157T1 shown in FIG. 34 is connected to a portion of the line section 1581A near the first end 1581a thereof. The through hole 157T2 shown in FIG. 34 is connected to a portion of the line section 1581B near the first end 1581b thereof.

The conductor layer 1573 shown in FIG. 34 is opposed to a portion of the conductor layer 1581 near the boundary between the line sections 1581A and 1581B, with the dielectric layer 157 interposed between the conductor layers 1573 and 1581.

Further, formed in the dielectric layer 158 are twenty-four ground through holes connected to the twenty-four ground through holes shown in FIG. 34.

Figure 36:
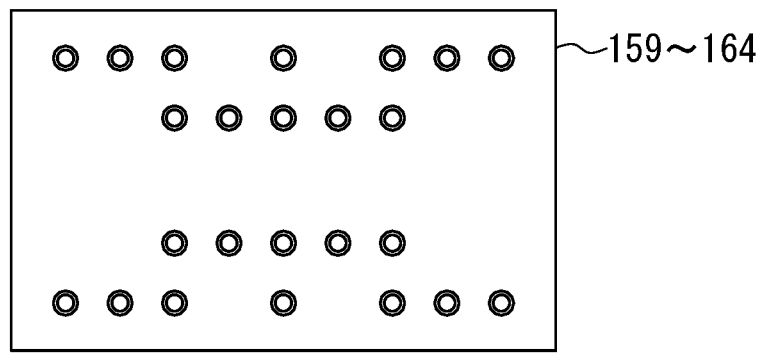
FIG. 36 is an explanatory diagram illustrating a patterned surface of each of a ninth to a fourteenth dielectric layer of the multilayer stack shown in FIG. 27.

FIG. 36 illustrates a patterned surface of each of the ninth to fourteenth dielectric layers 159 to 164. Twenty-four ground through holes are formed in each of the dielectric layers 159 to 164.

The twenty-four ground through holes shown in FIG. 35 are connected to the twenty-four ground through holes formed in the ninth dielectric layer 159. In the dielectric layers 158 to 164, every vertically adjacent through holes are connected to each other.

Figure 37:
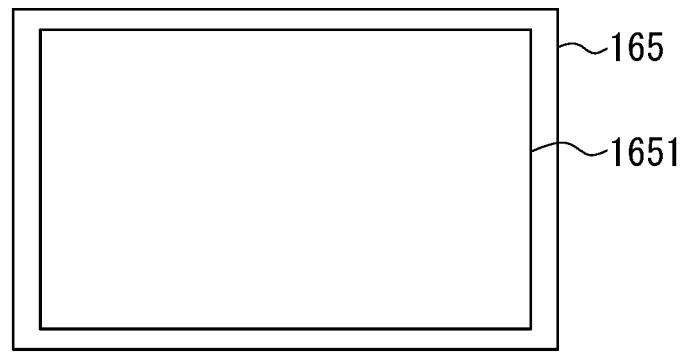
FIG. 37 is an explanatory diagram illustrating a patterned surface of a fifteenth dielectric layer of the multilayer stack shown in FIG. 27.

FIG. 37 illustrates a patterned surface of the fifteenth dielectric layer 165. A ground conductor layer 1651 is formed on the dielectric layer 165. The twenty-four ground through holes formed in the fourteenth dielectric layer 164 (see FIG. 36) are connected to the ground conductor layer 1651.

Although not illustrated, a conductor layer to be used as a mark is formed on the patterned surface of the sixteenth dielectric layer.

The multilayer stack 150 is formed by stacking the first to fifteenth dielectric layers 151 to 165 and the sixteenth dielectric layer such that the patterned surface of the first dielectric layer 151 serves as the bottom surface 150A. A surface of the sixteenth dielectric layer opposite to the patterned surface serves as the top surface 150B of the multilayer stack 150.

Correspondences between the circuit components of the multilayer electronic component 1 shown in FIG. 29 and the components of the multilayer stack 150 shown in FIG. 30 to FIG. 37 will now be described.

First, a description will be given of the capacitor 127A and the resonator 122A. The capacitor 127A is composed of the conductor layer 1521 shown in FIG. 31, the capacitor-forming portion 1531C of the conductor layer 1531 shown in FIG. 32, and the dielectric layer 152 interposed therebetween. The conductor layer 1521 is connected to the first input/output terminal 111 via the through hole 151T1.

The first conductor line 123A of the resonator 122A is composed of the resonator-forming portion 1531R of the conductor layer 1531 shown in FIG. 32. The first end of the resonator-forming portion 1531R is connected to the capacitor-forming portion 1531C. The portion of the resonator-forming portion 1531R near the second end thereof is connected to the ground conductor layer 113 of FIG. 30 via the through hole 152T3, the conductor layer 1523 and the through hole 151T3.

Next, the impedance transformer 124A will be described. The through hole line section 126A of the impedance transformer 124A is composed of the through holes 152T1 and 153T1, the three through holes 154T1 formed in the dielectric layers 154 to 156, the conductor layer 1571, and the through hole 157T1. The through holes 152T1 and 153T1 and the three through holes 154T1 are arranged such that their central axes are collinear, thereby constituting a through hole string 126AT shown in FIG. 27 and FIG. 28. The through hole 152T1 is connected to the conductor layer 1521 constituting the capacitor 127A.

The second conductor line 125A is composed of the line section 1581A of the conductor layer 1581 shown in FIG. 35. The portion of the line section 1581A near the first end 1581a thereof is connected to the through hole 157T1 located at an end of the through hole line section 126A.

Next, a description will be given of the capacitor 127C and the resonator 122C. The capacitor 127C is composed of the conductor layer 1522 shown in FIG. 31, the capacitor-forming portion 1532C of the conductor layer 1532 shown in FIG. 32, and the dielectric layer 152 interposed therebetween. The conductor layer 1522 is connected to the second input/output terminal 112 via the through hole 151T2.

The first conductor line 123C of the resonator 122C is composed of the resonator-forming portion 1532R of the conductor layer 1532 shown in FIG. 32. The first end of the resonator-forming portion 1532R is connected to the capacitor-forming portion 1532C. The portion of the resonator-forming portion 1532R near the second end thereof is connected to the ground conductor layer 113 of FIG. 30 via the through hole 152T4, the conductor layer 1524 and the through hole 151T4.

Next, the impedance transformer 124B will be described. The through hole line section 126B of the impedance transformer 124B is composed of the through holes 152T2 and 153T2, the three through holes 154T2 formed in the dielectric layers 154 to 156, the conductor layer 1572, and the through hole 157T2. The through holes 152T2 and 153T2 and the three through holes 154T2 are arranged such that their central axes are collinear, thereby constituting a through hole string 126BT shown in FIG. 27 and FIG. 28. The through hole 152T2 is connected to the conductor layer 1522 constituting the capacitor 127B.

The second conductor line 125B is composed of the line section 1581B of the conductor layer 1581 shown in FIG. 35. The portion of the line section 1581B near the first end 1581b thereof is connected to the through hole 157T2 located at an end of the through hole line section 126B.

Next, a description will be given of the capacitor 127B and the resonator 122B. The capacitor 127B is composed of the conductor layer 1573 shown in FIG. 34, the conductor layer 1581 shown in FIG. 35, and the dielectric layer 157 interposed therebetween. The resonator 122B is composed of the through hole string 122BT. The through hole string 122BT is composed of the through holes 151T5, 152T5 and 153T5, and three through holes 154T5 connected in series. The top end of the through hole string 122BT is connected to the conductor layer 1573 shown in FIG. 34. The bottom end of the through hole string 122BT is connected to the ground conductor layer 113 shown in FIG. 30.

The ground conductor layers 113 and 1651 are electrically connected to the plurality of ground through holes to constitute a ground section. The first conductor lines 123A and 123C and the second conductor lines 125A and 125B are surrounded by the ground section.

The first distributed constant line in the resonator 122A is composed of the first conductor line 123A and the ground section. The first distributed constant line in the resonator 122C is composed of the first conductor line 123C and the ground section.

The second distributed constant line in the impedance transformer 124A is composed of the second conductor line 125A and the ground section. The second distributed constant line in the impedance transformer 124B is composed of the second conductor line 125B and the ground section.

Now, the operation and effects of the multilayer electronic component 101 according to the present embodiment will be described. The multilayer electronic component 101 includes the band elimination filter 120. The stopband of the band elimination filter 120 is in the quasi-millimeter wave band of 10 to 30 GHz or the millimeter wave band of 30 to 300 GHz.

In the band elimination filter 120, the resonators 122A and 122C respectively include the first conductor lines 123A and 123C constituting the first distributed constant lines, and the impedance transformers 124A and 124B respectively include the second conductor lines 125A and 125B constituting the second distributed constant lines. Thus, like the first embodiment, the present embodiment reduces or eliminates characteristic variations of the band elimination filter 120, and prevents the characteristics of the band elimination filter 120 as actually fabricated from greatly differing from those as designed.

The impedance transformer 124A includes, in addition to the second conductor line 125A, the through hole line section 126A connected in series to the second conductor line 125A. The impedance transformer 124B includes, in addition to the second conductor line 125B, the through hole line section 126B connected in series to the second conductor line 125B. Like the first embodiment, the present embodiment enables the impedance transformers 124A and 124B to be easily designed and fabricated by utilizing the structural features of the multilayer stack 150 including a plurality of through holes.

By virtue of the foregoing, the present embodiment enables easy implementation of the band elimination filter 120, which is formed using the multilayer stack 150 and has a stopband in a quasi-millimeter or millimeter wave band.

Further, the present embodiment enables downsizing of the multilayer stack 150 relative to the case where the impedance transformers 124A and 124B are configured without through holes.

Like the first embodiment, the present embodiment enables easy adjustment of the length of the shortest current path in each of the impedance transformers 124A and 124B. The present embodiment thus enables the characteristics of the impedance transformers 124A and 124B to be easily adjusted by a slight design modification.

Figure 38:
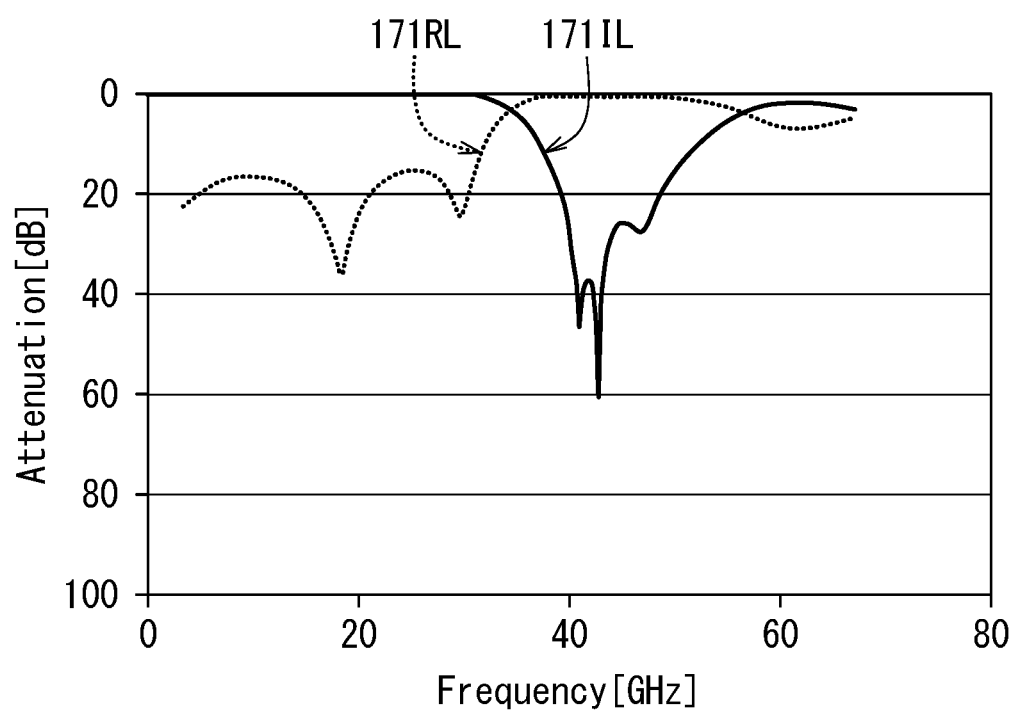
FIG. 38 is a characteristic diagram illustrating the characteristic of the multilayer electronic component according to the third embodiment of the invention.

An example of characteristics of the multilayer electronic component 101 will now be described. FIG. 38 illustrates an example of characteristics of the multilayer electronic component 101, more specifically, the frequency responses of the insertion loss and return loss of the multilayer electronic component 101. In FIG. 38, the horizontal axis represents frequency, and the vertical axis represents attenuation. In FIG. 38, the curve 171IL represents the frequency response of the insertion loss, and the curve 171RL represents the frequency response of the return loss.

In the present embodiment, the resonators 122A and 122C may be formed into half-wave resonators like the resonators 22A and 22B of the second embodiment. In such a case, each of the second end 123Ab of the first conductor line 123A and the second end 123Cb of the first conductor line 123C is open and not connected to the ground.

The other configuration, function, and effects of the present embodiment are the same as those of the first embodiment.

The present invention is not limited to the foregoing embodiments, and various modifications may be made thereto. For example, each of the first and second conductor lines may be composed of two or more of the plurality of conductor layers of the multilayer stack.

Further, the multilayer electronic component of the present invention may include, in addition to the band elimination filter, a filter section that has the function of a filter other than a band elimination or band pass filter.

Obviously, many modifications and variations of the present invention are possible in the light of the above teachings. Thus, it is to be understood that, within the scope of the appended claims and equivalents thereof, the invention may be practiced in other than the foregoing most preferable embodiments.

What is claimed is:

1. A multilayer electronic component comprising:
   a multilayer stack; and
   a band elimination filter formed using the multilayer stack, wherein
   the multilayer stack includes a plurality of dielectric layers and a plurality of conductor layers stacked together,
   the band elimination filter includes:
   a first input/output end;

a second input/output end;
a connection path connecting the first input/output end and the second input/output end; and
a first resonator coupled to the connection path,
the connection path includes an impedance transformer,
the first resonator includes a first conductor line constituting a first distributed constant line,
the impedance transformer includes a second conductor line constituting a second distributed constant line, and a through hole line section connected in series to the second conductor line,
each of the first and second conductor lines is formed of at least one of the plurality of conductor layers,
the through hole line section includes at least one through hole provided in the multilayer stack, and
the multilayer electronic component further comprises a band pass filter formed using the multilayer stack and electrically connected to the band elimination filter.

2. The multilayer electronic component according to claim 1, wherein
the band elimination filter further includes a capacitor for coupling the first resonator to the connection path.

3. The multilayer electronic component according to claim 2, wherein
the capacitor has a first end and a second end opposite to each other in circuit configuration,
the through hole line section has a first end and a second end opposite to each other in circuit configuration,
the first end of the capacitor is electrically connected to the first end of the through hole line section,
the second end of the capacitor is electrically connected to the first conductor line, and
the second end of the through hole line section is electrically connected to the second conductor line.

4. The multilayer electronic component according to claim 3, wherein
the first end of the capacitor and the first end of the through hole line section are electrically connected to one of the first and second input/output ends.

5. The multilayer electronic component according to claim 1, wherein
the through hole line section includes a plurality of through holes connected in series.

6. The multilayer electronic component according to claim 5, wherein
the plurality of through holes are arranged such that central axes thereof are collinear.

7. The multilayer electronic component according to claim 5, wherein
the plurality of through holes are arranged such that central axes of at least two of the plurality of through holes are not collinear.

8. The multilayer electronic component according to claim 1, wherein
the first conductor line has a first end and a second end, the first end being closest to the connection path in circuit configuration, the second end being farthest from the connection path in circuit configuration, and
the second end of the first conductor line is connected to a ground.

9. The multilayer electronic component according to claim 1, wherein
the first conductor line has a first end and a second end, the first end being closest to the connection path in circuit configuration, the second end being farthest from the connection path in circuit configuration, and
the second end of the first conductor line is open.

10. A multilayer electronic component comprising:
a multilayer stack; and
a band elimination filter formed using the multilayer stack, wherein
the multilayer stack includes a plurality of dielectric layers and a plurality of conductor layers stacked together,
the band elimination filter includes:
a first input/output end;
a second input/output end;
a connection path connecting the first input/output end and the second input/output end; and
a first resonator coupled to the connection path,
the connection path includes an impedance transformer,
the first resonator includes a first conductor line constituting a first distributed constant line,
the impedance transformer includes a second conductor line constituting a second distributed constant line, and a through hole line section connected in series to the second conductor line,
each of the first and second conductor lines is formed of at least one of the plurality of conductor layers,
the through hole line section includes at least one through hole provided in the multilayer stack,
the band elimination filter further includes a second resonator formed using the multilayer stack,
the first resonator is coupled to the connection path at a first point,
the second resonator is coupled to the connection path at a second point, and
the impedance transformer is located between the first point and the second point in circuit configuration.

11. The multilayer electronic component according to claim 10, wherein
the band elimination filter further includes a capacitor for coupling the first resonator to the connection path.

12. The multilayer electronic component according to claim 11, wherein
the capacitor has a first end and a second end opposite to each other in circuit configuration,
the through hole line section has a first end and a second end opposite to each other in circuit configuration,
the first end of the capacitor is electrically connected to the first end of the through hole line section,
the second end of the capacitor is electrically connected to the first conductor line, and
the second end of the through hole line section is electrically connected to the second conductor line.

13. The multilayer electronic component according to claim 12, wherein
the first end of the capacitor and the first end of the through hole line section are electrically connected to one of the first and second input/output ends.

14. The multilayer electronic component according to claim 10, wherein
the through hole line section includes a plurality of through holes connected in series.

15. The multilayer electronic component according to claim 14, wherein
the plurality of through holes are arranged such that central axes thereof are collinear.

16. The multilayer electronic component according to claim 14, wherein
the plurality of through holes are arranged such that central axes of at least two of the plurality of through holes are not collinear.

17. The multilayer electronic component according to claim 10, wherein the first conductor line has a first end and a second end, the first end being closest to the connection path in circuit configuration, the second end being farthest from the connection path in circuit configuration, and the second end of the first conductor line is connected to a ground.

18. The multilayer electronic component according to claim 10, wherein the first conductor line has a first end and a second end, the first end being closest to the connection path in circuit configuration, the second end being farthest from the connection path in circuit configuration, and the second end of the first conductor line is open.

* * * * *